US008411880B2

(12) United States Patent
Wang et al.

(10) Patent No.: US 8,411,880 B2
(45) Date of Patent: Apr. 2, 2013

(54) SOUND QUALITY BY INTELLIGENTLY SELECTING BETWEEN SIGNALS FROM A PLURALITY OF MICROPHONES

(75) Inventors: Song Wang, San Diego, CA (US); Dinesh Ramakrishnan, San Diego, CA (US); Eddie L. T. Choy, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1186 days.

(21) Appl. No.: 12/022,052

(22) Filed: Jan. 29, 2008

(65) Prior Publication Data

US 2009/0190769 A1 Jul. 30, 2009

(51) Int. Cl.
*H03F 99/00* (2009.01)
(52) U.S. Cl. .................................................. 381/122
(58) Field of Classification Search .................. 381/122
See application file for complete search history.

(56) References Cited

U.S. PATENT DOCUMENTS

| 5,602,962 | A | 2/1997 | Kellermann | |
|---|---|---|---|---|
| 2002/0126856 | A1* | 9/2002 | Krasny et al. | 381/94.1 |
| 2003/0095674 | A1* | 5/2003 | Lewis | 381/110 |
| 2003/0147538 | A1* | 8/2003 | Elko | 381/92 |
| 2004/0008850 | A1* | 1/2004 | Gustavsson | 381/92 |
| 2004/0042626 | A1* | 3/2004 | Balan et al. | 381/110 |
| 2004/0167777 | A1* | 8/2004 | Hetherington et al. | 704/226 |
| 2004/0252852 | A1* | 12/2004 | Taenzer | 381/119 |
| 2007/0055511 | A1* | 3/2007 | Gotanda et al. | 704/233 |
| 2007/0165879 | A1 | 7/2007 | Deng et al. | |
| 2007/0257840 | A1* | 11/2007 | Wang et al. | 342/383 |

FOREIGN PATENT DOCUMENTS

| JP | 07240990 | | 9/1995 |
|---|---|---|---|
| JP | 7240992 | A | 9/1995 |
| JP | 2001285433 | A | 10/2001 |
| JP | 2004173095 | A | 6/2004 |
| JP | 2007295085 | | 11/2007 |

OTHER PUBLICATIONS

International Preliminary Report on Patentability—PCT/US2009/032420, International Search Authority—European Patent Office—Mar. 30, 2010.
International Search Report and Written Opinion—PCT/US2009/032420, International Search Authority—European Patent Office—May 7, 2009.

* cited by examiner

*Primary Examiner* — Steven Loke
*Assistant Examiner* — Igwe U Anya
(74) *Attorney, Agent, or Firm* — Espartaco Diaz Hidalgo

(57) ABSTRACT

Sound signal reception is improved by utilizing a plurality of microphones to capture sound signals which are then weighed to dynamically adjust signal quality. A first sound signal and a second sound signal are obtained from first and second microphones, respectively, where the first and second sound signals originate from one or more sound sources. A first signal characteristic (e.g., signal power, signal signal-to-noise ratio, etc.) is obtained for the first sound signal and a second signal characteristic is obtained for the second sound signal. The first and second sound signals are weighed or scaled based on their respective first and second signal characteristics. The weighed first and second sound signals are then combined to obtain an output sound signal.

30 Claims, 14 Drawing Sheets

SOUND QUALITY BY INTELLIGENTLY SELECTING BETWEEN SIGNALS FROM A PLURALITY OF MICROPHONES

BACKGROUND

1. Field

Various features pertain to improving sound reception by utilizing multiple microphones to capture a signal and maximize the signal-to-noise ratio.

2. Background

Mobile devices (e.g., mobile phones, digital recorders, communication devices, etc.) are often used in different ways by different users. Such usage diversity could significantly affect the performance of voice reception by the mobile devices. The way that a mobile device is used varies from user to user and from time to time for the same user. Users have different communication needs, preferences for functionality, and habits of use that may result in a mobile device being used or held in different positions during operation. For example, one user may like to place the device up-side-down while using it to speak in speakerphone mode. In such cases, there may be no line-of-sight (LOS) between a microphone for the mobile device and the user, which may affect voice signal reception. In another example, a mobile device may be placed or positioned such that the reception of a desired voice signal by the microphone is blocked or hindered. In yet another example, a mobile device may be used by multiple users. In such cases, voice signal from individual users may be best captured by different microphones. For example, a first microphone may receive a first acoustic signal from a first user the best while a second microphone may receive a second acoustic signal from a second user the best.

The different ways in which users may use a mobile device often affects the reception of desired the sound or voice signals by a microphone for the mobile device, resulting in sound or voice quality degradation (e.g., decrease in signal-to-noise ratio (SNR)). In voice communications, especially mobile voice communications, voice or sound quality is a criterion for quality of service (QoS). The way a mobile device is used is one of many factors that may potentially affect QoS.

Consequently, a solution is needed that improves voice or sound reception at mobile devices despite the different ways in which users may position or orient the mobile devices.

SUMMARY

A method is provided for improving sound reception on a mobile device. A first sound signal may be obtained from a first microphone and a second sound signal may be obtained from a second microphone, wherein each of the first and second sound signals may include at least a portion of a first source signal from a first sound source. The first sound signal and the second sound signal may be obtained within overlapping time windows and may include independent mixtures of the first source signal and one or more other source signals and noise.

The first and second microphones may be positioned on different surfaces of the mobile device. A first signal characteristic (e.g., signal power, signal-to-noise ratio (SNR), signal energy, correlations, etc., and/or combinations and/or derivatives thereof) may be obtained for the first sound signal. Similarly, a second signal characteristic (e.g., signal power, signal-to-noise ratio (SNR), signal energy, correlations, etc., and/or combinations and/or derivatives thereof) may be obtained for the second sound signal. That is, both the first and second signal characteristics may be associated with a same signal characteristic. The first and second sound signals may be weighed based on the first and second signal characteristics. The weighed first and second sound signals may then be combined to obtain an output sound signal.

Additional signal processing may be performed on the output sound signal before the output signal is transmitted to an intended listener over a communication network. The additional signal processing may include at least one of echo cancellation, noise reduction, automatic gain control, and coding. The communication network may be a wireless communication network.

According to one feature, the first sound signal may be segmented into a first plurality of consecutive frames and the second sound signal may be segmented into a second plurality of consecutive frames. A first plurality of signal characteristics may be obtained for the first plurality of consecutive frames for the first sound signal. Similarly, a second plurality of signal characteristics may be obtained for the second plurality of consecutive frames for the second sound signal. The weighing and combining of the first and second sound signals may be performed on the first plurality of signal characteristics and the second plurality of signal characteristics.

According to one example, the weighing of the first and second sound signals may include (a) comparing the first signal characteristic and second signal characteristic, (b) scaling the first sound signal by zero and scaling the second sound signal by one if the second sound signal provides better sound quality than the first sound signal, and/or (c) scaling the first sound signal by one and scaling the second sound signal by zero if the first sound signal provides better sound quality than the second sound signal. Scaling the first sound signal by zero and scaling the second sound signal by one may be performed if the second signal characteristic is greater than the first signal characteristic by at least a minimum threshold amount if the first sound signal is currently being used. Similarly, scaling the first sound signal by one and scaling the second sound signal by zero may be performed if the first signal characteristic is greater than the second signal characteristic by at least the minimum threshold amount if the second sound signal is currently being used.

According to another feature, a first signal-to-noise ratio may be determined for the first sound signal and a second signal-to-noise ratio may be determined for the second sound signal. If the first signal-to-noise ratio is greater than the second signal-to-noise ratio, the first sound signal may be weighed to provide a greater contribution to the output sound signal than the second sound signal. Similarly, if the second signal-to-noise ratio is greater than the first signal-to-noise ratio, the second sound signal may be weighed to provide a greater contribution to the output sound signal than the first sound signal. The first signal-to-noise ratio may be obtained by (a) segmenting the first sound signal into a first plurality of consecutive frames, (b) obtaining a first plurality of consecutive signal powers for the first plurality of consecutive frames for the first sound signal, and/or (c) searching for a minimum signal power in the plurality of consecutive signal powers for the first plurality of consecutive frames to obtain a noise floor estimate with which to obtain the first signal-to-noise ratio. The second signal-to-noise ratio may be similarly obtained.

Yet another feature may provide for (a) calibrating the first and second microphones to have substantially the same sensitivity, (b) if the first signal characteristic is greater than the second signal characteristic, weighing the first sound signal to provide a greater contribution to the output sound signal than the second sound signal, and/or (c) if the second signal characteristic is greater than the first signal characteristic, weighing the second sound signal to provide a greater contribution to the output sound signal than the first sound signal. The first and second signal characteristics may be signal powers.

If the second sound signal provides improved sound quality over the first sound signal, the method may include (a) transitioning from the first sound signal to the second sound signal by blending the first sound signal with the second sound signal, and/or (b) gradually decreasing the contribution of the first sound signal and increasing the contribution of the second sound signal. The contribution from the first sound signal may be decreased and the contribution from the second sound signal may be increased according to linear functions. Alternatively, the contribution from the first sound signal is decreased and the contribution from the second sound signal is increased according to non-linear functions.

According to one feature, the first and second microphones may be selected from a plurality of three or more microphones on the mobile device, wherein such selection is performed based on which of the three or more microphones has the best signal quality.

In yet another example, at least one additional sound signal may be obtained from at least one additional microphone, wherein the at least one additional sound signal includes at least a portion of a first source signal from a first sound source. At least one additional signal characteristic may be obtained for the at least one additional sound signal.

The at least one additional sound signal and the first and second sound signals may be weighed based on the first signal characteristic, second signal characteristic, and the at least one additional signal characteristic. The weighed first sound signal, second sound signal, and at least one additional sound signal may be combined to obtain an output sound signal.

A mobile device is provided comprising: a first and a second microphone and a signal selection module. The first microphone may be configured to obtain a first sound signal. The second microphone may be configured to obtain a second sound signal, wherein each of the first and second sound signals includes at least a portion of a first source signal from a first sound source. The signal selection module may be configured or adapted to (a) obtain a first signal characteristic for the first sound signal, (b) obtain a second signal characteristic for the second sound signal, (c) weigh the first and second sound signals based on the first and second signal characteristics, and/or (d) combine the weighed first and second sound signals to obtain an output sound signal. Both the first and second signal characteristics may be associated with a same signal characteristic. The first sound signal and the second sound signal may be obtained from an acoustic signal within overlapping time windows, and the first and second microphones are positioned on different surfaces of the mobile device.

The mobile device may also include a signal processor and a transmitter. The signal processor may be configured or adapted to perform at least one of echo cancellation, noise reduction, automatic gain control, and coding on the output signal. The transmitter may be configured or adapted to transmit the processed output signal via a wireless communication network.

According to one aspect, the mobile device may further comprise (a) a first analog-to-signal converter configured or adapted to segment the first sound signal into a first plurality of consecutive frames, and/or (b) a second analog-to-signal converter configured or adapted to segment the second sound signal into a second plurality of consecutive frames. The signal selection module may be further configured or adapted to (a) obtain a plurality of consecutive signal characteristics for the first plurality of consecutive frames for the first sound signal, and/or (b) obtain a second plurality of consecutive signal characteristics for the second plurality of consecutive frames for the second sound signal. The weighing and combining of the first and second sound signals may be performed based on the first plurality of signal characteristics and the second plurality of signal characteristics.

According to another aspect, the signal selection module may be further configured or adapted to (a) compare the first signal characteristic and second signal characteristic, (b) scale the first sound signal by zero and scaling the second sound signal by one if the second sound signal provides better sound quality than the first sound signal, and/or scale the first sound signal by one and scaling the second sound signal by zero if the first sound signal provides better sound quality than the second sound signal. Additionally, the signal selection module may be further configured or adapted to (a) scale the first sound signal by zero and scaling the second sound signal by one is performed if the second signal characteristic is greater than the first signal characteristic by at least a minimum threshold amount if the first sound signal is currently being used; and/or (b) scale the first sound signal by one and scaling the second sound signal by zero is performed if the first signal characteristic is greater than the second signal characteristic by at least the minimum threshold amount if the second sound signal is currently being used.

According to another feature, the signal selection module may be further configured or adapted to (a) determine a first signal-to-noise ratio for the first sound signal, (b) determine a second signal-to-noise ratio for the second sound signal, (c) weigh the first sound signal to provide a greater contribution to the output sound signal than the second sound signal if the first signal-to-noise ratio is greater than the second signal-to-noise ratio, and/or (d) weigh the second sound signal to provide a greater contribution to the output sound signal than the first sound signal if the second signal-to-noise ratio is greater than the first signal-to-noise ratio.

According to yet another feature, the signal selection module may be further configured or adapted to select the first and second microphones from a plurality of three or more microphones on the mobile device, wherein such selection is performed based on which of the three or more microphones has the best signal quality.

In some configurations, the signal selection module may be further configured or adapted to (a) obtain at least one additional sound signal from at least one additional microphone, wherein the at least one additional sound signal includes at least a portion of the first source signal from the first sound source, (b) obtain at least one additional signal characteristic for the at least one additional sound signal, (c) weight the at least one additional sound signal and the first and second sound signals based on the first signal characteristic, second signal characteristic, and the at least one additional signal characteristic, and/or (d) combine the weighed first sound signal, second sound signal, and at least one additional sound signal to obtain an output sound signal.

Consequently, a mobile device is provided comprising: (a) means for obtaining a first sound signal from a first microphone, (b) means for obtaining a second sound signal from a second microphone, wherein each of the first and second sound signals includes at least a portion of a first source signal from a first sound source, (c) means for obtaining a first signal characteristic for the first sound signal, (d) means for obtaining a second signal characteristic for the second sound signal, (e) means for weighing the first and second sound signals based on the first and second signal characteristics, and/or (f) means for combining the weighed first and second sound signals to obtain an output sound signal. The mobile device may also include (a) means for performing at least one of echo cancellation, noise reduction, automatic gain control, and coding on the output signal, and/or (b) means for transmitting the processed output signal via a wireless communication network.

According to one aspect, the mobile device may also include (a) means for comparing the first signal characteristic and second signal characteristic, (b) means for scaling the first sound signal by zero and scaling the second sound signal by one if the second sound signal provides better sound quality than the first sound signal, and/or (c) means for scaling the first sound signal by one and scaling the second sound signal by zero if the first sound signal provides better sound quality than the second sound signal.

Yet another feature provides the mobile device including (a) means for weighing the first sound signal to provide a greater contribution to the output sound signal than the second sound signal if the first signal characteristic is greater than the second signal characteristic, and/or (b) means for weighing the second sound signal to provide a greater contribution to the output sound signal than the first sound signal if the second signal characteristic is greater than the first signal characteristic.

A circuit is also provided, wherein the circuit is adapted to (a) obtain a first sound signal from a first microphone, (b) obtain a second sound signal from a second microphone, wherein each of the first and second sound signals includes at least a portion of a first source signal from a first sound source, (c) obtain a first signal characteristic for the first sound signal, (d) obtain a second signal characteristic for the second sound signal, (e) weight the first and second sound signals based on the first and second signal characteristics, and/or (f) combine the weighed first and second sound signals to obtain an output sound signal. The circuit may be further adapted or configured to (a) scale the first sound signal by zero and scaling the second sound signal by one if the second sound signal provides better sound quality than the first sound signal, and/or (b) scale the first sound signal by one and scaling the second sound signal by zero if the first sound signal provides better sound quality than the second sound signal. Yet another aspect provides for the circuit to be further adapted to (a) weight the first sound signal to provide a greater contribution to the output sound signal than the second sound signal if the first signal characteristic is greater than the second signal characteristic, and/or (b) weight the second sound signal to provide a greater contribution to the output sound signal than the first sound signal if the second signal characteristic is greater than the first signal characteristic. In one example, the circuit may be implemented as an integrated circuit.

A computer-readable medium is also provided comprising instructions for improving sound signal reception, which when executed by a processor causes the processor to (a) obtain a first sound signal from a first microphone, (b) obtain a second sound signal from a second microphone, wherein each of the first and second sound signals includes at least a portion of a first source signal from a first sound source, (c) select the first and second microphones from a plurality of three or more microphones, wherein such selection is performed based on which of the three or more microphones has the best signal quality, (d) obtain a first signal characteristic for the first sound signal, (e) obtain a second signal characteristic for the second sound signal, (f) weight the first and second sound signals based on the first and second signal characteristics, and/or (g) combine the weighed first and second sound signals to obtain an output sound signal.

BRIEF DESCRIPTION OF THE DRAWINGS

The features, nature, and advantages of the present aspects may become more apparent from the detailed description set forth below when taken in conjunction with the drawings in which like reference characters identify correspondingly throughout.

DETAILED DESCRIPTION

Figure 1:
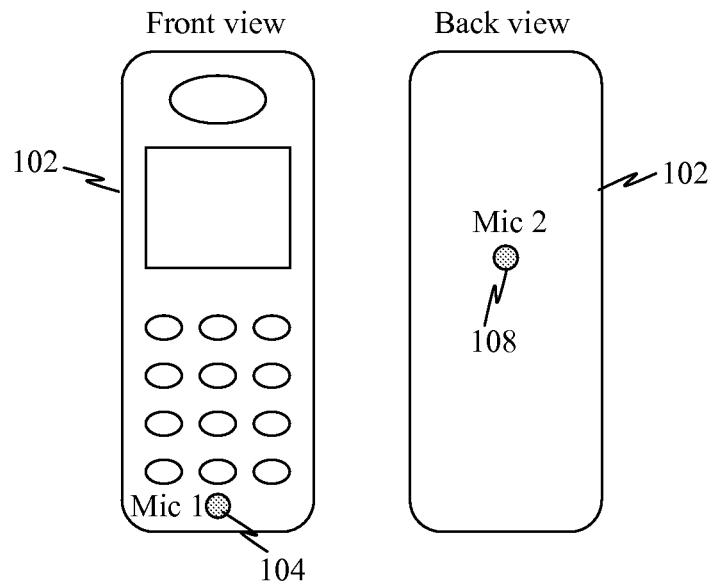
FIG. 1 illustrates an example of a mobile phone 102 having two microphones for improved sound/voice signal reception.

In the following description, specific details are given to provide a thorough understanding of the configurations. However, it will be understood by one of ordinary skill in the art that the configurations may be practiced without these specific detail. For example, circuits may be shown in block diagrams in order not to obscure the configurations in unnecessary detail. In other instances, well-known circuits, structures and techniques may be shown in detail in order not to obscure the configurations.

Also, it is noted that the configurations may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

In one or more examples and/or configurations, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor or circuit. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above are also be included within the scope of computer-readable media.

Moreover, a storage medium may represent one or more devices for storing data, including read-only memory (ROM), random access memory (RAM), magnetic disk storage mediums, optical storage mediums, flash memory devices and/or other machine readable mediums for storing information.

Furthermore, configurations may be implemented by hardware, software, firmware, middleware, microcode, or any combination thereof. When implemented in software, firmware, middleware or microcode, the program code or code segments to perform the necessary tasks may be stored in a computer-readable medium such as a storage medium or other storage(s). A processor or circuit may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

On feature provides for mounting a plurality of microphones on a mobile device that is configured to intelligently select and/or combine sound signals from the plurality of microphones to improve the quality of sound signal reception. When the mobile device captures sound signals, it may dynamically select a sound signal from one of the microphones or it may dynamically combine a plurality of the sound signals to obtain improved or optimum signal quality.

Generally, a first sound signal and a second sound signal are obtained from first and second microphones, respectively, where the first and second sound signals originate from one or more sound sources. A first signal characteristic (e.g., signal power, signal-to-noise ratio (SNR), signal energy, correlations, etc., and/or combinations and/or derivatives thereof) is obtained for the first sound signal and a second signal characteristic (e.g., signal power, signal-to-noise ratio (SNR), signal energy, correlations, etc., and/or combinations and/or derivatives thereof) is obtained for the second sound signal. The first and second sound signals are weighed based on the first and second signal characteristics. That is, the first and second signals may be scaled by a value between zero (0) and one (1), inclusive. Such weights may be fractional values that add up to a constant value (e.g., one). The weighed first and second sound signals are then combined to obtain an output sound signal. In one example, a particular microphone or input sound signal may be selected as the output sound signal by scaling the input sound signal by one (1) while signals from other microphones are scaled by zero (0), thereby eliminating their contribution to the output sound signal. In other examples, the input sound signals from different microphones are scaled according to their respective signal-to-noise ratios or signal powers, for example, and combined (e.g., added) to produce the output sound signal.

FIG. 1 illustrates an example of a mobile phone 102 having two microphones for improved sound/voice signal reception. A first microphone 104 may be positioned on a front surface of the mobile phone 102. A second microphone 108 may be positioned on a back surface of the mobile phone 102 opposite the front surface. The location of the first and second microphones 104 and 108 may be selected such that it is very unlikely that both microphones can be blocked by the user at the same time.

Figure 2:
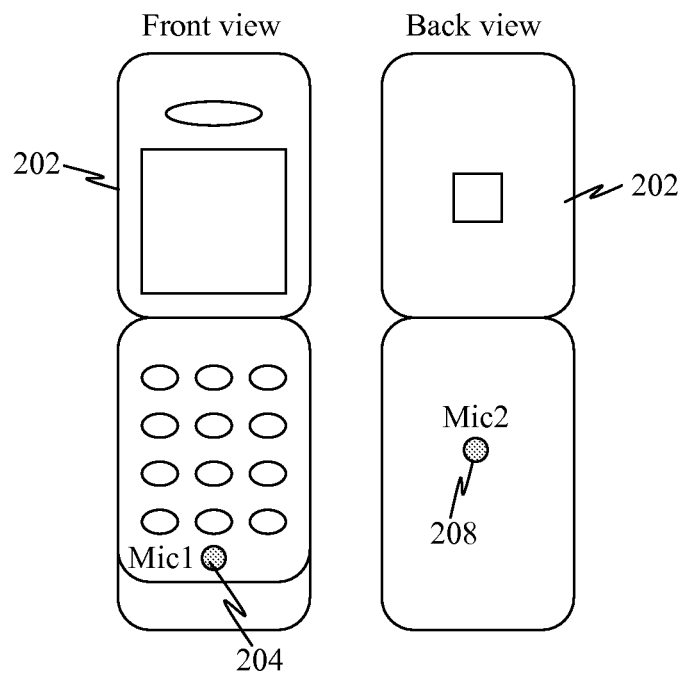
FIG. 2 illustrates an example of a folding mobile phone 202 having two microphones for improved sound/voice signal reception.

FIG. 2 illustrates an example of a folding mobile phone 202 having two microphones for improved sound/voice signal reception. A first microphone 204 may be positioned on a front surface of the mobile phone 202. A second microphone 208 may be positioned on a back surface of the mobile phone 202 opposite the front surface. The location of the first and second microphones 204 and 208 may be selected such that it is very unlikely that both microphones can be blocked by the user at the same time.

While the mobile devices illustrated in FIGS. 1 and 2 are shown as including two microphones on opposite front and back surfaces, other configurations may include additional microphones positioned at different positions, on different surfaces, and/or different locations of the mobile device. By using a plurality of microphones at different positions, surfaces, and/or locations, sound or audio signal may be captured such that signal diversity can be explored to improve overall sound reception and/or noise cancellation.

For the mobile phone 102 and 202 illustrated in FIGS. 1 and 2, the mobile phone may be configured to intelligently select a signal captured by one of the microphones or combine two or more captured sound signals to improve or maximize the output signal sound quality. During operation, the mobile phone 102 and 202 may monitor one or more signal characteristics (e.g., signal power, signal energy, signal-to-noise ratio, etc.) for both the first and second sound signals. The first and second sound signals may then be weighed to either (a) select the best signal as the output signal or (b) to contribute to a portion of each signal to the output sound signal.

During operation (e.g., during a call), if the mobile phone 102 and 202 determines that the sound signal from the second microphone is better than that of the first microphone (e.g., the signal on the second microphone has a better SNR than the signal on the first microphone), it may switch to process the sound signal captured by the second microphone and transmits it to the far-end listener. Similarly, if the mobile phone 102 and 202 determines that the sound signal captured by the first microphone is better than that of the second microphone (e.g., the signal on the first microphone has a better SNR than the signal on the second microphone), it switches back to process signal from the first microphone and transmits it to the far-end listener. Alternatively, rather than switching to the best signal, the sound signals may be combined according to their respective weight. That is, sound signals with better sound qualities may be weighed more heavily than sound signals with lesser sound qualities. The term "sound signal" includes, but is not limited to, audio signals, speech signals, noise signals, and/or other types of signals that may be acoustically transmitted and captured by a microphone. While various examples herein may describe mobile phones and mobile devices, the various features may also be implemented on digital recorders, communication devices, processors, circuits, and other types of devices.

Figure 3:
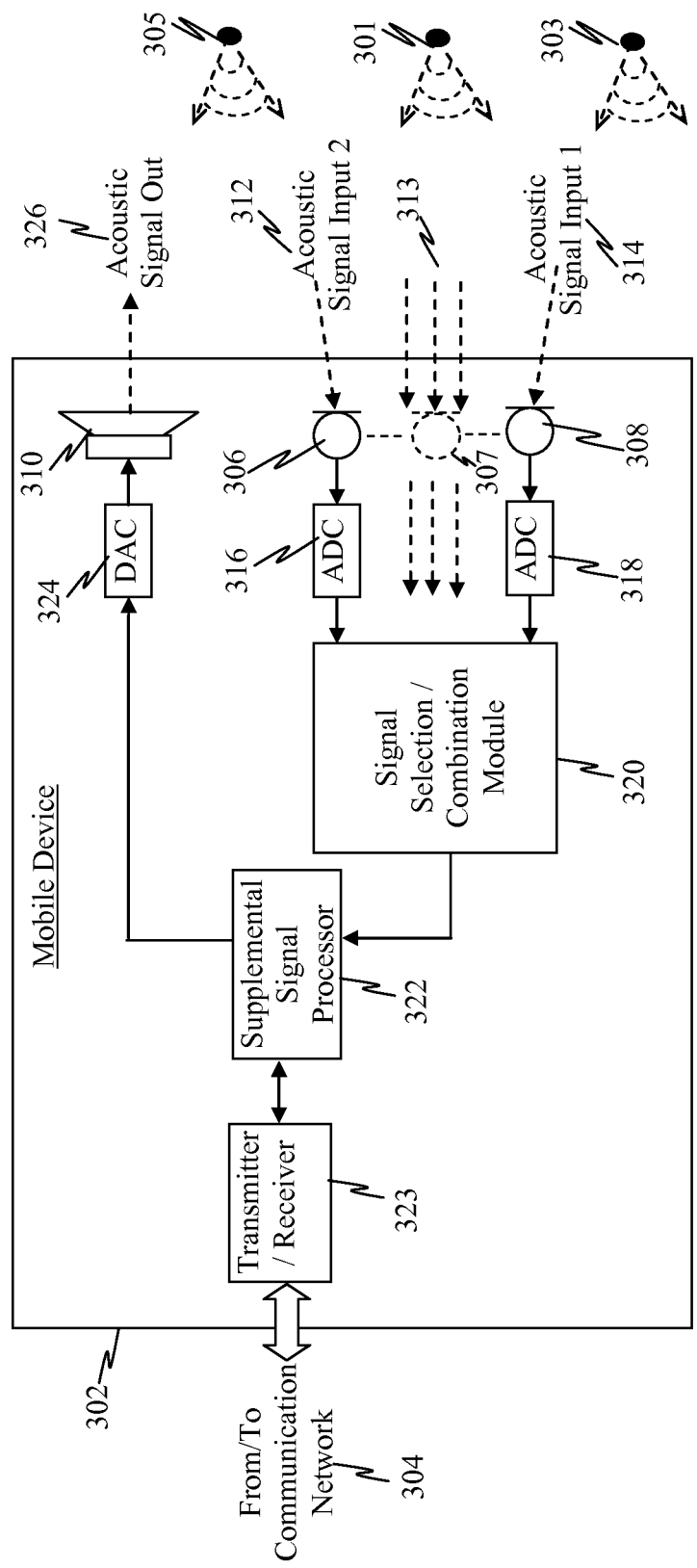
FIG. 3 is a block diagram illustrating one example of a mobile device having two or more microphones and configured to provide improved sound/voice signal reception.

FIG. 3 is a block diagram illustrating one example of a mobile device having two or more microphones and configured to provide improved sound/voice signal reception. The mobile device 302 may serve to facilitate communications between a user and a remote listener over a (e.g., wireless or wired) communication network 304. The mobile device 302 may include at least two microphones 306 and 308 and at least one speaker 310. The microphones 306 and 308 may receive acoustic signal inputs 312 and 314 from one or more sound source 301, 303, and 305 (e.g., one or more users) which are then digitized by analog-to-digital converters 316 and 318 to obtain sound signals. In some configurations, a plurality of additional microphones 307 may be used to capture acoustic signals 313 from different directions in order to improve sound reception and/or noise cancellation. For example, on some configurations, a plurality of microphones may be mounted on different surfaces of a mobile device, at intersections between two or more surfaces, and/or at different positions. The acoustic signals 313 from the additional microphones 307 may be similarly digitized by analog-to-digital converters to obtain additional sound signals. In some examples, the mobile device 302 may be configured or adapted to select and use a subset of the microphones (e.g., a first and second microphone) from the plurality of microphones (e.g., three or more) available to the device.

The acoustic signals received by the one or more microphones 306, 307, and 308 may be a combination and/or mixture of at least one source signal from the one more sound sources 301, 303, and/or 305 and/or noise. The source (original) acoustic signals from each of the sound sources 301, 303, and/or 305 may take different paths to reach each of the microphones 306, 307, and 308. The source acoustic signals from two or more sound sources 301, 303, and/or 305 may add up, combine, or mix as they propagate from the sound sources 301, 303, and/or 305 toward the two or more microphones 306, 307, and 308 across different acoustic paths. The two or more microphones 306, 307, and 308 capture the resulting (mixed) acoustic signals. The resulting (mixed) acoustic signals are captured by each of the two or more microphones 306, 307, and 308 as sound signals and are processed (e.g., weighted, filtered, and/or combined) to improve the captured signal quality.

A signal selection and/or combination module 320 may implement an algorithm that dynamically (a) selects between the two or more digitized sound signals and/or (b) combines the two or more digitized sound signals according to dynamically obtained weights, based on one or more factors, to achieve the best sound or audio quality for an output sound signal. The output sound signal may be subsequently processed by a supplemental signal processor 322 that performs, for example, echo cancellation, noise reduction, automatic gain control, and/or coding. The processed output sound signal is then transmitted by a transmitter/receiver module 323 over a communication network 304. For example, the digitized sound signal may be transmitted wirelessly through a wireless communication network. Similarly, the mobile device 302 may receive sound signals over the communication network 304, which may be processed by the supplemental signal processor 322 before passing through a digital-to-analog converter 324. The received signal then passes to the at least one speaker 310 so it can be acoustically transmitted to the user as an acoustic signal output 326.

In some configurations, the signal selection and/or combination module 320 may continuously or periodically compare the two or more digitized sound signals to determine how to best obtain, select, and/or generate an output sound signal. That is, the signal selection and/or combination module 320 may obtain one or more signal characteristics for the two or more digitized sound signals and assign weights to each sound signal to obtain a desired output sound signal.

When transitioning from one combination of signals to another combination of signals, the weight for each signal may be increased and/or decreased gradually to avoid abrupt changes in the output sound signal. In the configuration where weights are adjusted to select/switch between two or more signals, the signal selection module 320 may wait a minimum amount of time between signal switches or it may wait until the second signal improves on the first signal by a minimum threshold to avoid unnecessary frequent switching between microphones.

Figure 4:
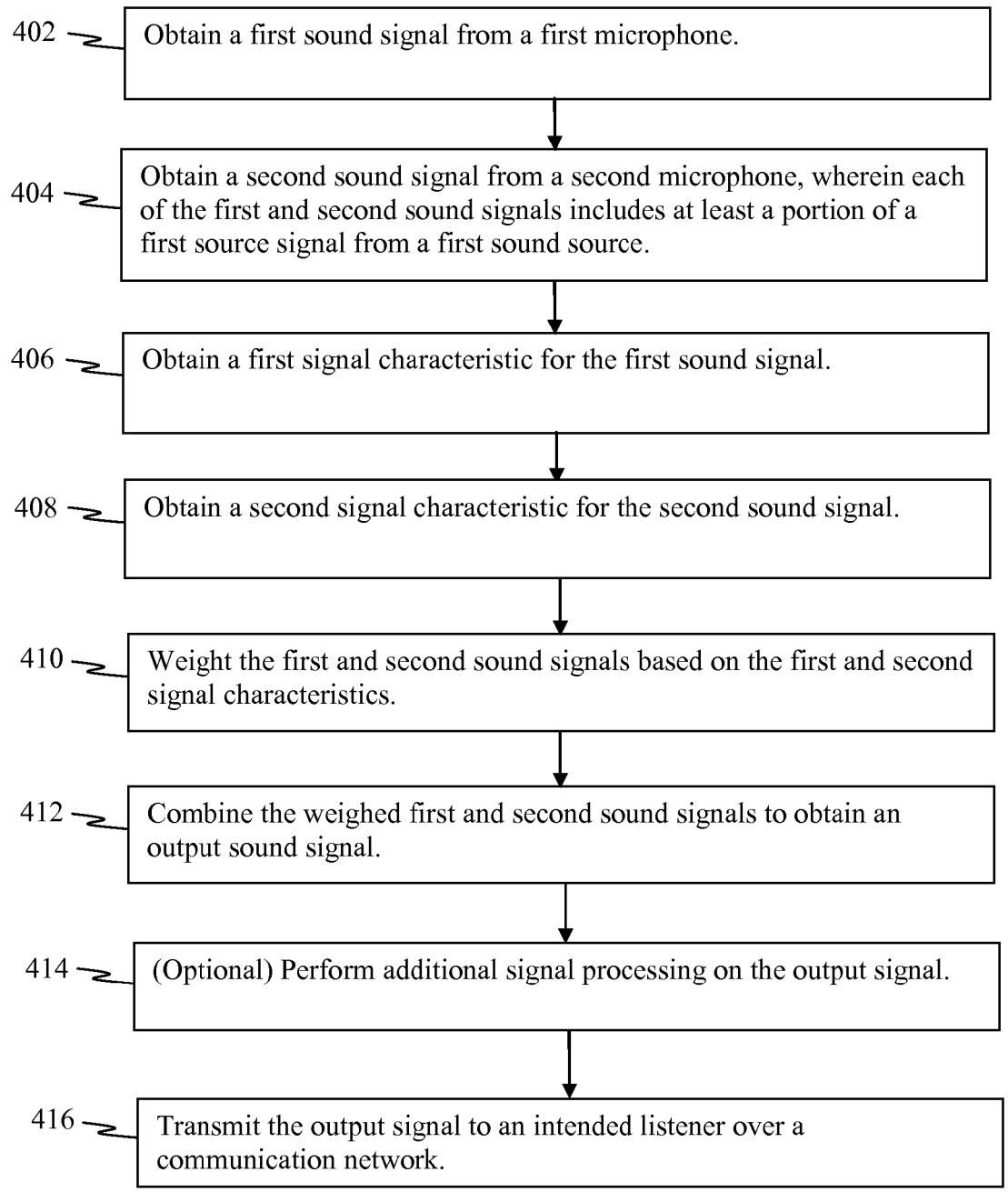
FIG. 4 is a flow chart illustrating a method operational on a mobile device having two microphones and configured to combine two input sound signals from the microphones to improve sound/voice signal reception.

FIG. 4 is a flow chart illustrating a method operational on a mobile device having two microphones and configured or adapted to combine two input sound signals from the microphones to improve sound/voice signal reception. A first sound signal is obtained from a first microphone 402. A second sound signal is obtained from a second microphone, wherein each of the first and second sound signals includes at least a portion of a first source signal from a first sound source 404. That is, the first and second sound signals may be obtained from one or more acoustic signals from the one or more sound sources. The first and second microphones may be positioned on different surfaces of the mobile device. The first sound signal and the second sound signal may be obtained within overlapping time windows. A first signal characteristic may be obtained for the first sound signal 406 and a second signal characteristic may be obtained for the second sound signal 408. For example, such the signal characteristics may include one or more of noise-to-signal ratios, signal powers, etc. The first and second sound signals may be weighed based on the first and second signal characteristics 410. The weighed first and second sound signals may be combined to obtain an output sound signal 412. Additional signal processing may be performed on the output sound signal 414 prior to transmitting the output sound signal to an intended listener over a communication network 416. Such additional signal processing may include, for example, at least one of echo cancellation, noise reduction, automatic gain control, and coding.

By adjusting the weights of the first and second sound signals, the method illustrated in FIG. 4 may be used to (a) combine the first and second sound signal to generate an output sound signal and/or (b) select between the first and second sound signals. This enables the mobile device to obtain signals from one or both microphones to better capture sound from one or more sound sources, whether it be a single sound source (e.g.; a single user) or multiple sound sources (e.g., different users speaking into different microphones).

In one example, the first sound signal may be segmented into a first plurality of consecutive frames and a signal characteristic may be obtained for each frame of the first plurality of consecutive frames, thereby obtaining a first plurality of signal characteristics. Similarly, the second sound signal may be segmented into a second plurality of consecutive frames and a signal characteristic may be obtained for each frame of the second plurality of consecutive frames, thereby obtaining a second plurality of signal characteristics. Consequently, weighing and/or combining of the first and second sound signals may be performed on (a) a frame by frame basis between corresponding frames of the first and second sound signals or (b) a frame set by frame set basis, wherein each frame set has a plurality of frames.

In the example illustrated in FIG. 3, the digitized sound signals sampled by the analog-to-digital converters 316 and 318 may pass through one or more buffers (which may be part of the selection module 320 or distinct modules, for example) to segment them into frames. Such buffers may have preset sizes that store a plurality of signal samples making up a frame. An analog-to-digital converter and corresponding buffer may be referred to as a signal segmenter. The comparison between the first signal characteristic for the first sound signal and the second signal characteristic for the second sound signal may then be performed on their corresponding frames. Such signal characteristics may include, for example, signal power, signal-to-noise ratio (SNR), energy, correlation, combinations thereof and/or derivations thereof.

In other configurations, more than two microphones may be used. At least one additional sound signal may be obtained from at least one additional microphone, wherein the at least one additional sound signal may include at least a portion of a first source signal from a first sound source. At least one additional plurality of signal characteristics may be obtained for the at least one additional sound signal. The at least one additional sound signal and the first and second sound signals may be weighed based on the first plurality of signal characteristics, second plurality signal characteristics, and the at least one additional plurality signal characteristics. The weighed first sound signal, second sound signal, and at least one additional sound signal may be combined to obtain the output sound signal.

Figure 5:
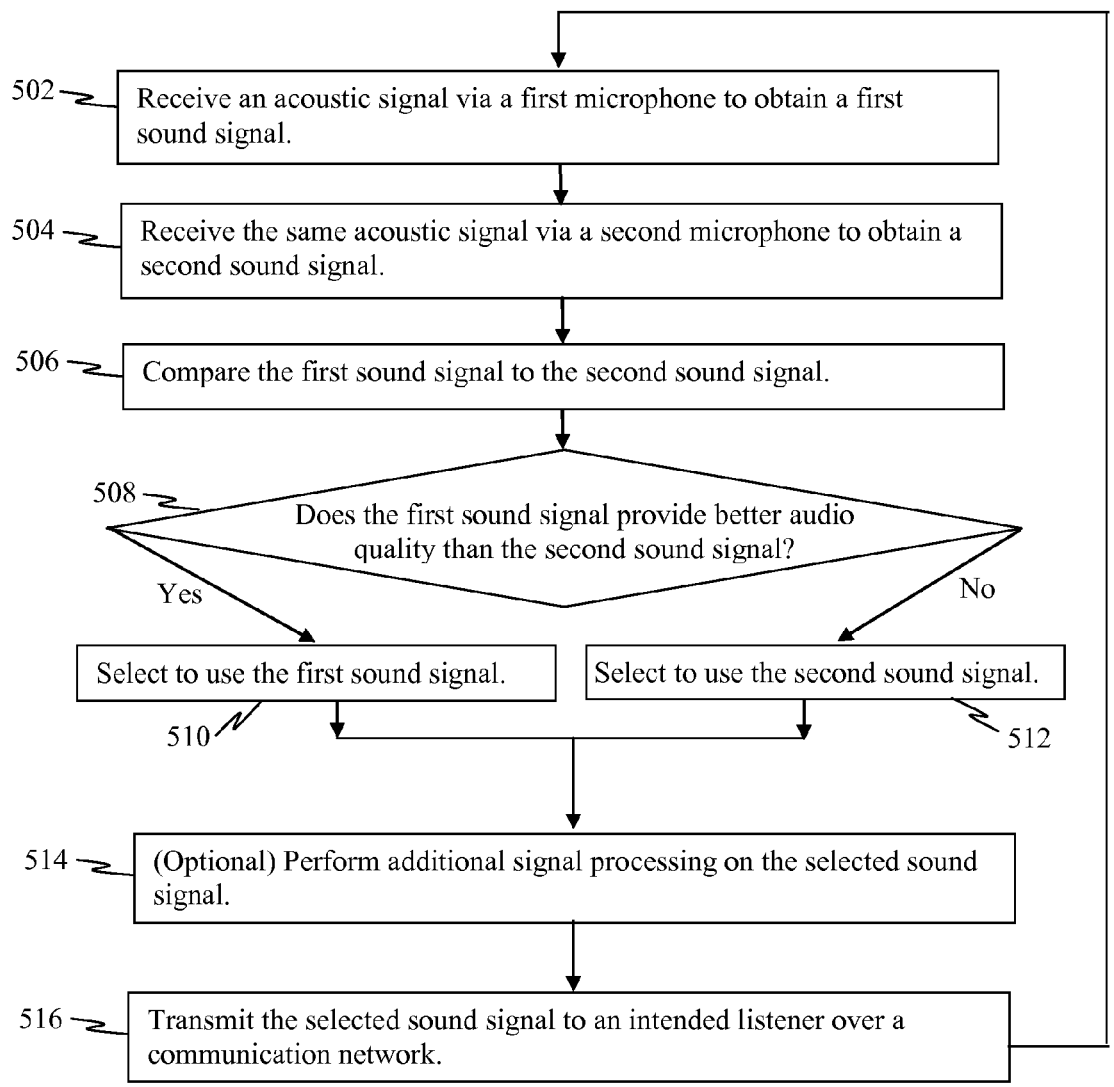
FIG. 5 is a flow chart illustrating a method operational on a mobile device having two or more microphones and configured to select between two input sound signals to improve sound/voice signal reception.

FIG. 5 is a flow chart illustrating a method operational on a mobile device having two or more microphones and configured to select between two or more input sound signals to improve sound/voice signal reception. An acoustic signal may be received via a first microphone to obtain a first sound signal 502. Similarly, another acoustic signal may be received via a second microphone to obtain a second sound signal 504. The first and second microphones may be positioned at different places of the mobile device so that the first and second sound signals may exhibit different signal characteristics (e.g., different signal-to-noise ratios or signal powers). The first sound signal may be compared to the second sound signal 506 to determine whether the first sound signal provides better sound or audio quality than the second sound signal 508. If the first sound signal provides better sound quality, the first sound signal is selected 510. Otherwise, the second sound signal is selected 512. Additional signal processing (e.g., background noise removal, etc.) may be performed on the selected sound signal 514 prior to being transmitted to an intended listener over a communication network 516.

In various examples, selecting between a first sound signal from a first microphone and a second sound signal from a second microphone may be performed based on their respective signal-to-noise ratios or signal powers.

In comparing the first sound signal and the second sound signal and selecting between the two signals a weighing scheme may be adapted to perform signal switching. A first signal characteristic, corresponding to a first frame or frame set of the first sound signal, and second signal characteristic, corresponding to a second frame or frame set of the second sound signal, may be obtained. The first and second signal characteristics may then be compared. If the second sound signal provides better sound quality than the first sound signal (as indicated by their respective signal characteristics), the first sound signal may be scaled by zero and the second sound signal may be scaled by one. Otherwise, if the first sound signal provides better sound quality than the second sound signal, the first sound signal may be scaled by one and the second sound signal may be scaled by zero.

In one example, the first sound signal may scaled by zero and the second sound signal may be scaled by one if the second signal characteristic is greater than the first signal characteristic by at least a minimum threshold amount. Similarly, the first sound signal may be scaled by one and the second sound signal may be scaled by zero if the first signal characteristic is greater than the second signal characteristic by at least the minimum threshold amount. The minimum threshold amount introduces a hysteresis characteristic to the switching between the first sound signal and the second sound signal to avoid frequent unwanted switching. That is, the switching from one sound signal to the other sound signal occurs more slowly and/or less frequently by introducing the minimum threshold amount.

Microphone Selection Based on SNR Monitoring

Figure 6:
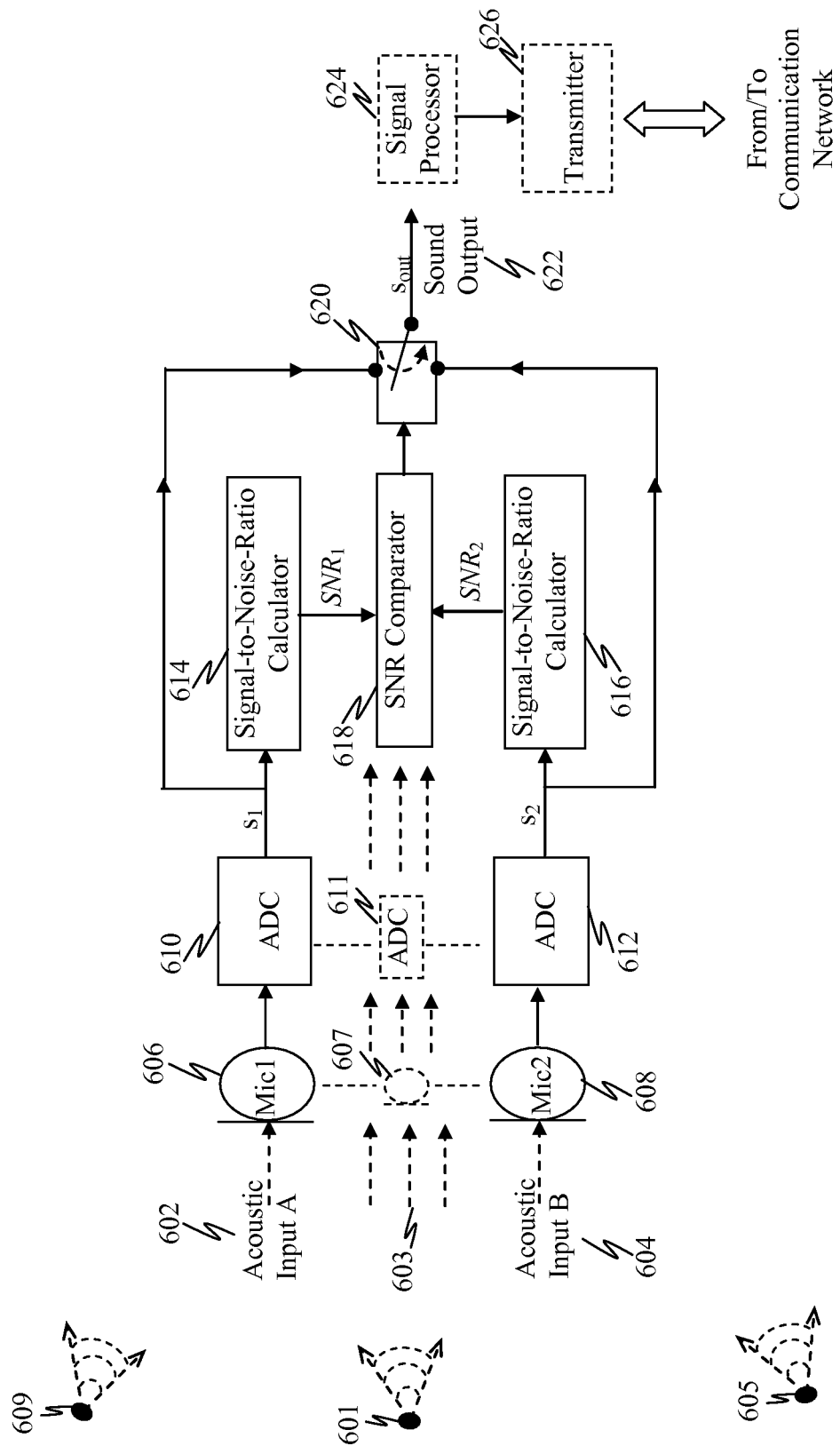
FIG. 6 is a block diagram illustrating how a mobile device may select between two or more input sound signals from different microphones based on signal-to-noise ratios to improve sound quality.

FIG. 6 is a block diagram illustrating how a mobile device may select between two or more input sound signals from different microphones based on signal-to-noise ratios to improve sound quality. One or more sound sources 601, 605, and 609 (e.g., users, etc.) may generate one or more acoustic signals (e.g., voice, audio, music, etc.) that is perceived as acoustic input signals 602, 603, and 604. Of the one or more sound sources 601, 605 and 609, some may provide wanted sound signals (e.g., voice from a user of the mobile device) while other may provide unwanted sound signals (e.g., noise, voices from other nearby people, etc.). A first acoustic input signal A 602 is captured by a first microphone 606 as a first sound signal and a second acoustic input signal B 604 is captured by a second microphone 608 as a second sound signal. Acoustic signal A 602 and acoustic signal B 604 may originate from the same sound sources but may take different paths prior to reaching their respective microphones. Consequently, acoustic signal A 602 may exhibit different characteristics from acoustic signal B 604. The captured acoustic signals A 602 and B 604 may then be digitized by analog-to-digital converters 610 and 612 into respective first and second sound signals. Additional acoustic signals 603 may also be captured by one or more additional microphones 607 and digitized by analog-to-digital converters 611 into additional sound signals to improve signal capture.

A first signal-to-noise ratio calculator 614 may determine a SNR for the first sound signal (e.g., digitized input signal A 602). Similarly, a second signal-to-noise ratio calculator 616 may determine a SNR for the second sound signal (e.g., digitized input signal B 604). A SNR comparator 618 may then compare the signal-to-noise ratios (corresponding to first and second sound signals and other sound signals) and may select the one with the best SNR value by controlling a switch 620. In this manner, the signal with the best SNR (i.e., largest) may be passed through as a sound output signal 622. In some configurations, a signal processor 624 may subsequently perform additional processing on the output sound signal 622 (e.g., echo cancellation, noise reduction, automatic gain control (AGC), coding, etc.) before it is transmitted by a transmitter 626 over a communication network to an intended listener.

As previously noted, an input sound signal is segmented into consecutive sample groups, denoted as frames. Each frame may contain a number of consecutive samples. Then, the consecutive frames are grouped into frame sets. For the examples and equations discussed, the following notations are defined:

N denotes number of samples in a frame.

M denotes number of frames in a frame set.

$\Psi_k(\mu)$ denotes the μth frames set which is consisted of M consecutive frames.

$\Phi_k(\mu, m)$ denotes the mth frame in $\Psi_k(\mu)$. Here m takes value from 0 to M−1. The frames in frame set $\Psi_k(\mu)$ are $\Phi_k(\mu, 0)$ through $\Phi_k(\mu, M-1)$ $s_k(\mu, m, n)$ denotes the nth sample in $\Phi_k(\mu, m)$. Here, n takes value from 0 to N−1.

All the subscript k refers to the kth microphone.

Figure 7:
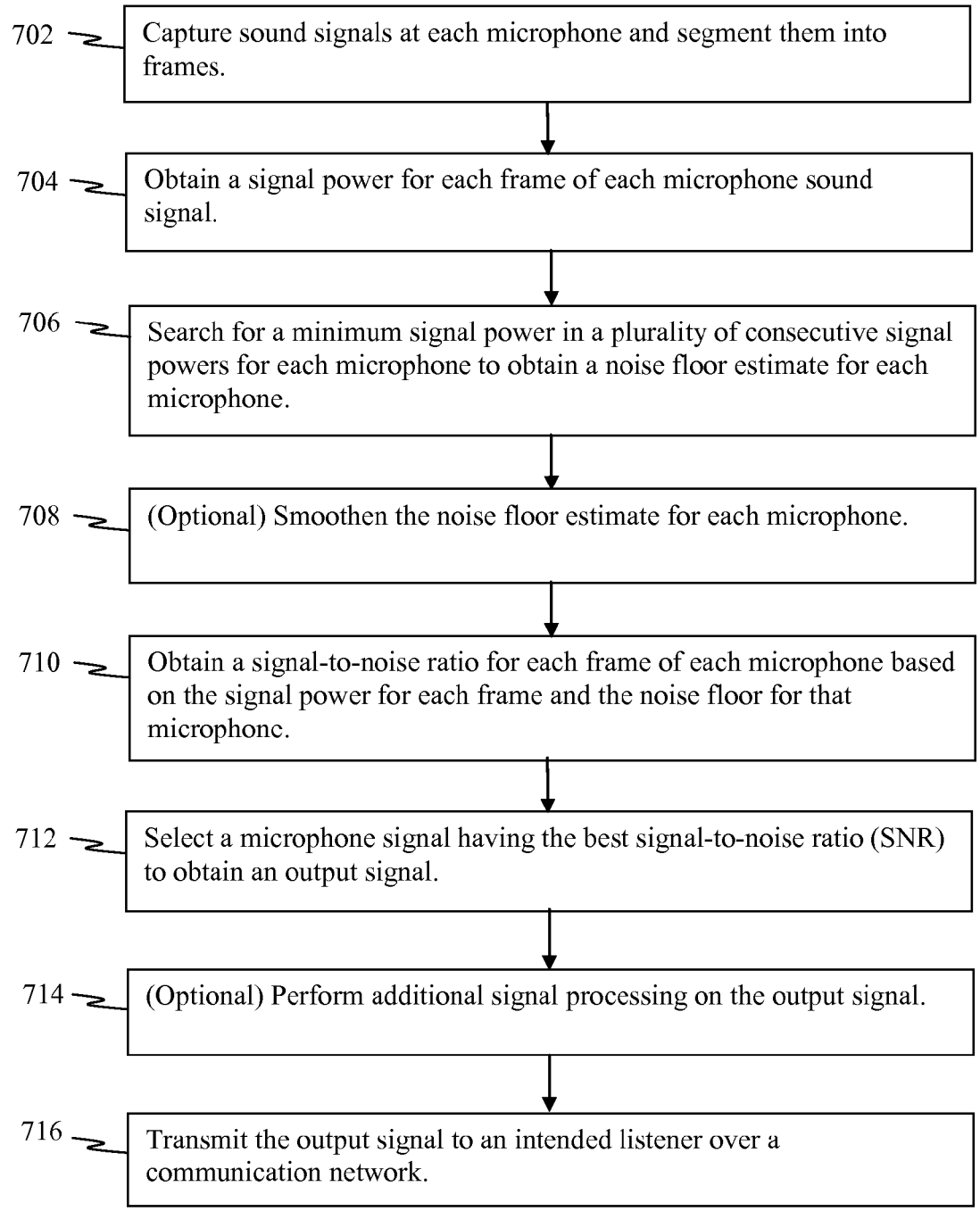
FIG. 7 is a flow chart illustrating a method operational on a mobile device to perform microphone selection based on signal-to-noise ratio monitoring.

FIG. 7 is a flow chart illustrating a method operational on a mobile device to perform microphone selection based on signal-to-noise ratio monitoring. This method may serve to continuously or periodically monitor and update a noise floor for each of two or more microphone signals. Sound signals are captured by each microphone (e.g., from acoustic sound signals) and segmented into frames 702, with each of the frames containing N signal samples. As an example, the number N can be set to the number of samples collected during a period of ten (10) milliseconds (ms). Then, a signal power for each signal frame of each microphone (e.g., power $P_k(m)$ for frame m of the kth microphone) may be calculated or obtained 704 using, for example, Equation 1:

$$P_k(\mu M + m) = \sum_{n=0}^{N-1} s_k^2((\mu M + m)N + n) \quad \text{(Equation 1)}$$

$$n = 0, \ldots, N-1, m = 1, \ldots, M-1, \mu \in Z$$

In Equation 1, subscript k denotes an individual microphone, n is an integer denoting a signal sample in the mth frame, m denotes a frame within a set of frames, and μ denotes a frame set for a particular microphone signal. Then, a search may be performed for a minimum signal power, denoted as noise floor estimate $NFE_k(u)$, in M consecutive signal powers 706 (e.g., $P_k(\mu M+m), m=0, \ldots, M-1$) using, for example, Equation 2:

$$NFE_k(u) = \min\{P_k(uM), \ldots, P_k(uM+M-1)\} \; u \in Z \quad \text{(Equation 2)}$$

In Equation 2, u is an integer that denotes a period that contains a set of M consecutive frames. The searched minima $NFE_k(u)$ are, for example, the noise floors for the corresponding microphone channel of the uth period that contains M consecutive frames. Note that the noise floor for a particular frame set is approximately the minimum frame signal power for that frame set. Consequently, a noise floor estimate (also referred to as minimum signal power) $NFE_k(u)$ (as in Equation 2) may be obtained by taking the lowest of the noise floors for a plurality of consecutive frames.

Figure 8:
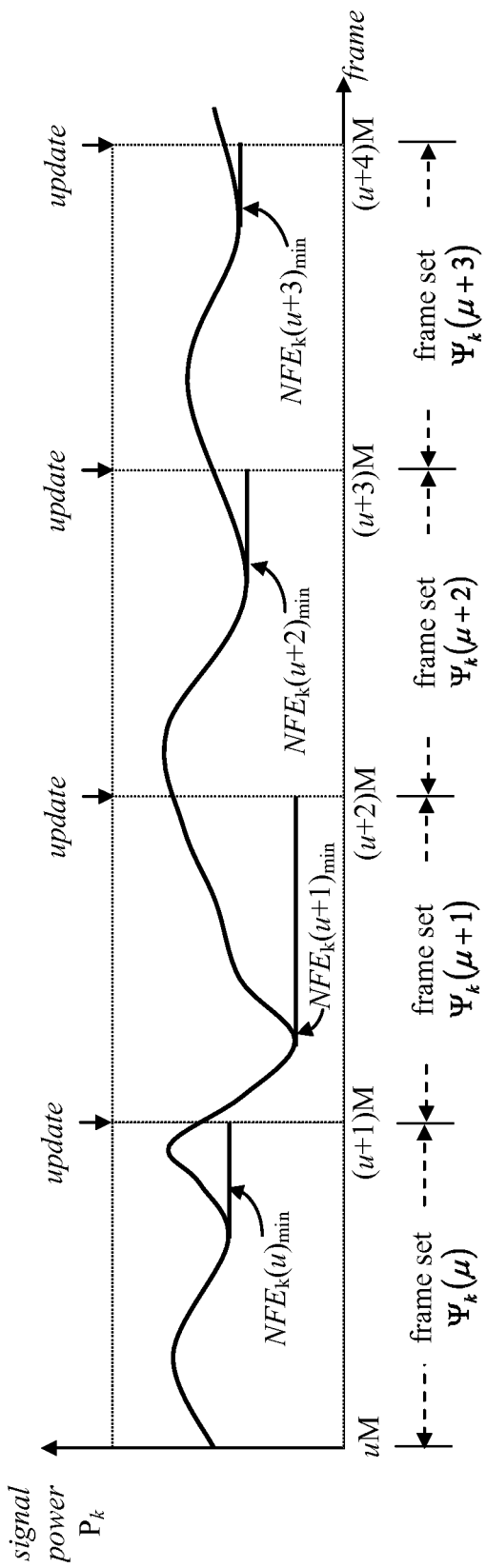
FIG. 8 graphically illustrates an example of a search process for a minimum signal power within a microphone signal.

FIG. 8 graphically illustrates an example of a search process for a minimum signal power within a microphone signal. In this example, the minimum signal power $NFE_k(\cdot)_{min}$ for each set of frames may be obtained. For example, a first minimum power $NFE_k(\mu)_{min}$ is obtained for a first frame set $\Psi_k(\mu)$, a second minimum power $NFE_k(\mu+1)_{min}$ is obtained for a second frame set $\Psi_k(\mu+1)$, a third minimum power $NFE_k(\mu+2)_{min}$ is obtained for a third frame set $\Psi_k(\mu+2)$, and a fourth minimum power $NFE_k(\mu+3)_{min}$ is obtained for a fourth frame set $\Psi_k(\mu+3)$.

Referring back to FIG. 7, to avoid significant variation in the noise floor estimate, the noise floor may be smoothened 708, for example, using Equation 3:

$$NF_k(u) = \alpha NF_k(u-1) + (1-\alpha)NFE_k(u) \; 0 < \alpha < 1 \quad \text{(Equation 3)}$$

A signal SNR for each signal frame of each microphone may then be obtained based on the signal power for each frame and the noise floor for that microphone 710. The SNR for each frame in frame set $\Psi_k(\mu)$ may be calculated, for example, using Equation 4:

$$SNR_k(uM + m) = \frac{P_k(uM + m)}{NF_k(u)} \quad \begin{array}{l} m = 0, \ldots, M-1 \\ u \in Z \end{array} \quad \text{(Equation 4)}$$

For real time applications where the noise floor of current frame set $NF_k(u)$ may not be immediately available, the signal SNR may be computed, for example, using Equation 5 (based on the noise floor of previous frame set $NF_k(u-1)$):

$$SNR_k(uM + m) = \frac{P_k(uM + m)}{NF_k(u-1)} \quad \begin{array}{l} m = 0, \ldots, M-1 \\ u \in Z \end{array} \quad \text{(Equation 5)}$$

An output signal $s_{out}(t)$ is obtained by selecting the microphone signal having the best SNR 712, for example, by using Equation 6:

$$s_{out}((uM + m)N + n) = \quad \text{(Equation 6)}$$

$$\begin{cases} s_1((uM + m)N + n) & SNR_1(uM + m) > SNR_2(uM + m) \\ s_2((uM + m)N + n) & SNR_1(uM + m) < SNR_2(uM + m) \end{cases}$$

where $s_1(t)$ and $s_2(t)$ are signals captured by the first microphone and second microphone at time t, respectively. Output signal $s_{out}(t)$ is the signal after the selection process. Note that the signal selection between the two signals $s_1(t)$ and $s_2(t)$ may be performed from frame to frame so that the best signal may be selected for each frame time period.

Additional signal processing (e.g., echo cancellation, noise reduction, AGC, coding, etc.) may be performed on the output signal $s_{out}(t)$ 714 prior to being transmitted to an intended listener over a communication network 716.

In order to avoid unnecessary frequent switching between signals, a minimum improvement threshold may be used. For example, an output signal $s_{out}$ may be selected according to Equation 7:

$$s_{out}((uM + m)N + n) = \quad \text{(Equation 7)}$$

$$\begin{cases} s_{inactive}((uM + m)N + n) & SNR_{inactive}(uM + m) > \\ & SNR_{active}(uM + m) + \\ & Q_1(uM + m) \\ s_{active}((uM + m)N + n) & \text{otherwise} \end{cases}$$

In Equation 7, $s_{active}$ denotes a microphone signal that is currently used (selected) and $s_{inactive}$ denotes the microphone signal not currently used. $SNR_{inactive}(uM+m)$ denotes the signal-to-noise ratio SNR of the microphone signal that is not currently used. At a given time, the inactive signal-to-noise ratio $SNR_{inactive}(uM+m)$ can be either $SNR_1(uM+m)$ or $SNR_2(uM+m)$. Similarly, $SNR_{active}(uM+m)$ denotes the SNR of the microphone signal in use (currently selected) and can be either $SNR_1(uM+m)$ or $SNR_2(uM+m)$ at a given time. $Q_1(uM+m)$ is a positive real number which serves as a hysteresis threshold for switching.

The hysteresis threshold $Q_1(uM+m)$ may be a dynamic measure rather than a static measure. For example, if a first signal (having a first signal characteristic) from a first microphone A is currently used, a second signal characteristic of a second signal from a second microphone B may exceed the first signal characteristics by an extra threshold $Q_1$ to be used. If the second signal characteristic (associated with the second signal of the second microphone B) does not exceed the first signal characteristics (associated with the first signal of the first microphone A) by the extra threshold $Q_1$, the algorithm continues to use the first signal from the first microphone A. On the other hand, if the second signal from the second microphone B (having a second signal characteristic) is currently used, the first signal characteristic of the first signal for the first microphone A may exceed the second signal characteristic by an extra threshold $Q_1$ before the first signal from the first microphone A is used. Otherwise, the algorithm continues to use the second signal from the second microphone B.

Figure 9:
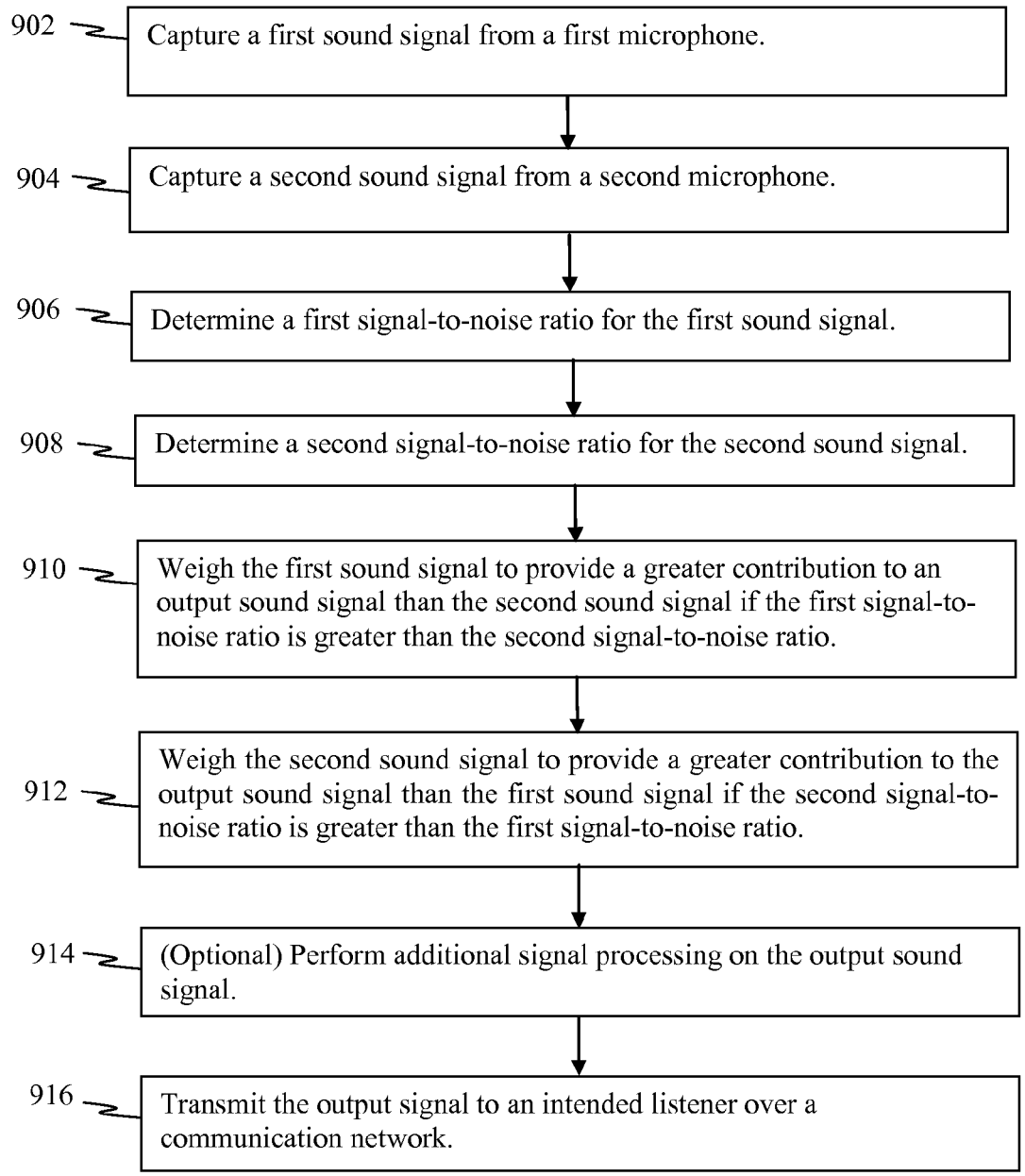
FIG. 9 is a flow chart illustrating a method operational on a mobile device to weight captured sound signals from two microphones based on signal-to-noise ratio monitoring.

FIG. 9 is a flow chart illustrating a method operational on a mobile device to weight captured sound signals from two microphones based on signal-to-noise ratio monitoring. A first sound signal may be captured from a first microphone 902 (from a first acoustic signal) and a second sound signal may be capture from a second microphone 904 (from a second acoustic signal). A first signal-to-noise ratio may be determined for the first sound signal 906 and a second signal-to-noise ratio may be determined for the second sound signal 908. If the first signal-to-noise ratio is greater than the second signal-to-noise ratio, the first sound signal may be weighed (e.g., scaled between zero and one, inclusive) to provide a greater contribution to an output sound signal than the second sound signal 910. If the second signal-to-noise ratio is greater than the first signal-to-noise ratio, the second sound signal may also be weighed to provide a greater contribution to the output sound signal than the first sound signal 912. Additional signal processing may subsequently be performed on the output sound signal 914 before it is transmitted to an intended listener over a communication network 916.

In obtaining the signal-to-noise ratio for each of the first sound signal, the first sound signal may be segmented into a plurality of consecutive frames. The plurality of consecutive frames may be grouped into a plurality of consecutive frame sets. A plurality of consecutive signal powers is then obtained for the plurality of consecutive frames for the first sound signal. In each of the plurality of consecutive frame sets, a minimum signal power may then be searched in the consecutive signal powers inside the frame set for the first sound signal to obtain a noise floor estimate with which to obtain the first signal-to-noise ratio. The second sound signal may be similarly processed to obtain the second signal-to-noise ratio. A comparison may be performed between the first and second signal-to-noise ratios. This SNR comparison may be conducted on frame-by-frame base or on SNRs of multiple consecutive frames. For the latter, the signal switch may only occur when the switching criterion is met for a number of consecutive frames.

Microphone Selection Based on Signal Power

Figure 10:
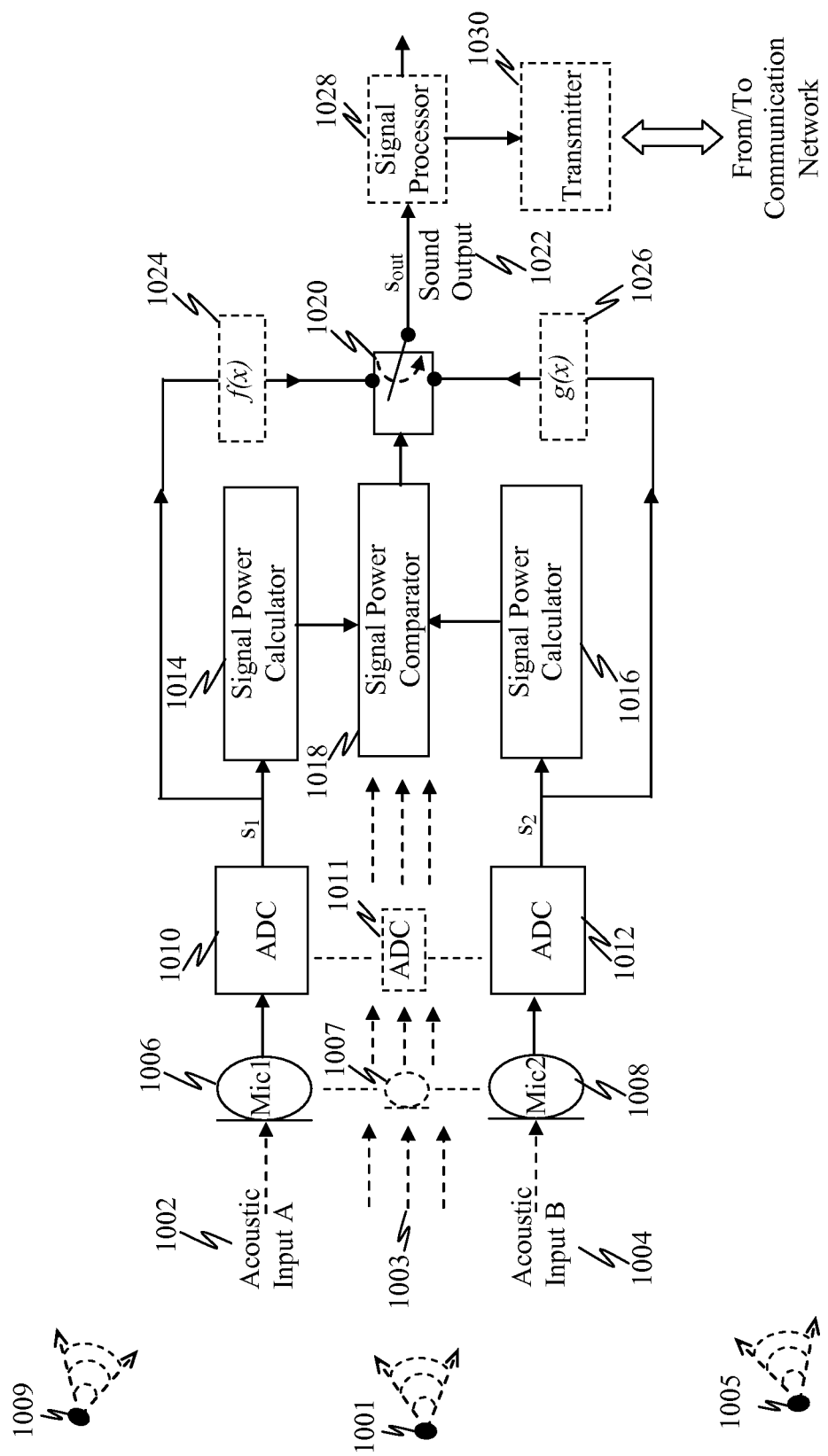
FIG. 10 is a block diagram illustrating a mobile device that may be configured to select between two input sound signals from different microphones based on signal powers to improve sound quality.

FIG. 10 is a block diagram illustrating a mobile device that may be configured to select between two input sound signals from different microphones based on signal powers to improve sound quality. In an environment with prevailing diffuse noise, the SPL (sound pressure level) may be similar almost everywhere. When there is no desired speech, the SPL or signal power at the two or more microphones of a mobile device will be similar to each other. However, if there is desired speech to be captured, the SPL or signal power at the two microphones can be different depending on location of the mouth reference point (MRP) or sound source and the position of the mobile device. In such case, if the two or more microphones have the same sensitivity, i.e., they produce the same signal level with the same SPL (sound pressure level), the decision of which microphone signal to use can be made without calculating actual signal SNR.

In this example, a first acoustic input signal A 1002 may be captured by a first microphone 1006 as a first sound signal and a second acoustic input signal B 1004 may be captured by a second microphone 1008 as a second sound signal. Acoustic signal A 1002 and acoustic signal B 1004 may originate from one or more of the same sound sources 1001, 1005, and/or 1009 but may take slightly different paths prior to reaching their respective microphones. The first sound signal (for the first microphone 1002) and the second sound signal (for the second microphone B 1004) may then be digitized by analog-to-digital converters 1010 and 1012, respectively. Additional acoustic signals 1003 may also be captured by one or more additional microphones 1007 as sound signals and digitized by analog-to-digital converters 1011 to improve signal capture.

A first signal power calculator 1014 may determine a signal power for the digitized first sound signal (corresponding to acoustic input signal A 1002). Similarly, a second signal power calculator 1016 may determine a signal power for the digitized second sound signal (corresponding to acoustic input signal B 1004). A signal power comparator 1018 may then compare the signal powers (corresponding to first and second sound signals and any other digitized sound signals) and select the one with the highest signal power by controlling a switch 1020. In this manner, the signal with the best signal power (i.e., largest) is passed through as a sound output signal 1022 for subsequent signal processing and transmission over a communication network to an intended listener.

In some configurations, a signal processor 1028 may subsequently perform additional processing on the sound output signal 1022 (e.g., echo cancellation, noise reduction, automatic gain control (AGC), coding, etc.) before it is transmitted by a transmitter 1030 over a communication network to an intended listener.

Figure 11:
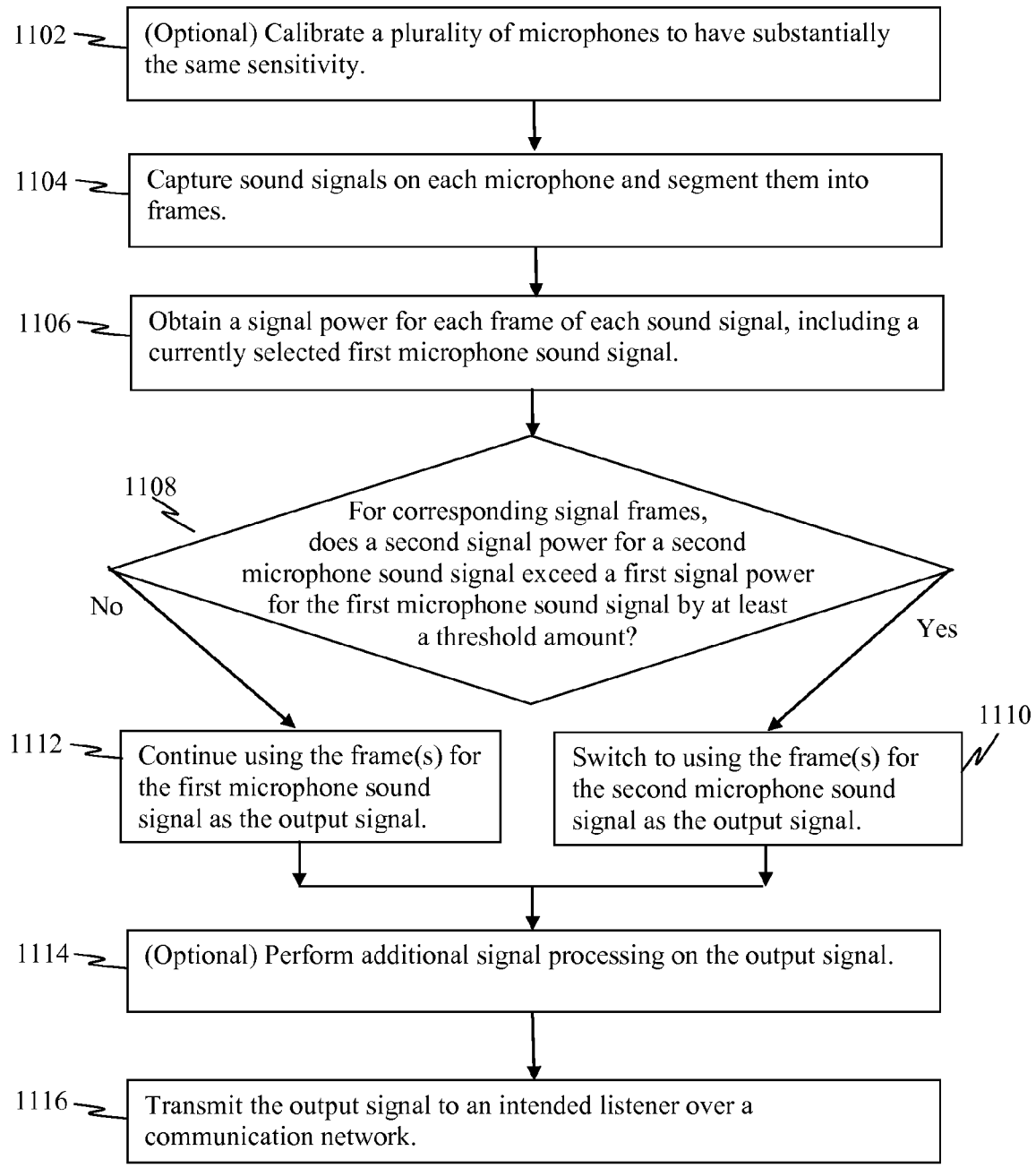
FIG. 11 is a flow chart illustrating a method operational on a mobile device to perform microphone selection based on signal power monitoring.

FIG. 11 is a flow chart illustrating a method operational on a mobile device to perform microphone selection based on signal power monitoring. While this example uses two microphones, the same method can be extended to support signal selection from additional microphones. If the two or more microphones are not already calibrated, they may be calibrated to have the same sensitivity 1102 before making switching decision.

Sound signals may be captured by each microphone (from acoustic signals) and segmented into frames 1104, with each of the frames containing N signal samples. As an example, the number N may be the number of samples collected during a period of ten (10) milliseconds (ms). Then, a signal power for each signal frame of each sound signal (e.g., signal power $P_k(m)$ for frame m of the kth microphone sound signal) is calculated or obtained, including a currently selected first microphone sound signal 1106 using, for example, Equation 8:

$$s_{out}(mN+n) = \begin{cases} s_{inactive}(mN+n) & P_{inactive}(m) > P_{active}(m) + \\ & Q_2(m) n = 0, \ldots, \\ & N-1 \, m \in Z \\ s_{active}(mN+n) & \text{otherwise,} \end{cases} \quad \text{(Equation 8)}$$

In Equation 8, $P_{inactive}(m)$ is the signal power for the microphone not in use (not selected) and $P_{inactive}(m)$ is the signal power for the microphone in use (currently selected microphone signal) for signal frame m. $Q_2$ (m) is a positive real number which serves as a hysteresis threshold for switching. The example in FIG. 11 assumes that the first microphone signal is currently selected. For corresponding signal frames, a decision is made as to whether a second signal power for a second microphone sound signal exceeds a first signal power for the first microphone sound signal by at least a threshold amount 1108. If the second signal power exceeds the first signal power by at least the threshold amount, the mobile device switches to using the frame(s) for the second microphone sound signal as the output signal 1010. That is, if $P_{inactive}(m)$ exceeds $P_{active}(m)$ by a minimum margin $Q_2$ (m), the inactive microphone sound signal becomes the active microphone sound signal and the active microphone sound signal becomes inactive. Otherwise, the mobile device continues using the frame(s) for the first microphone sound signal as the output signal 1112. Additional signal processing (e.g., echo cancellation, noise reduction, gain control, coding, etc.) may be performed on the output signal 1114 prior to transmitting the output signal to an intended listener over a communication network 1116.

Figure 12:
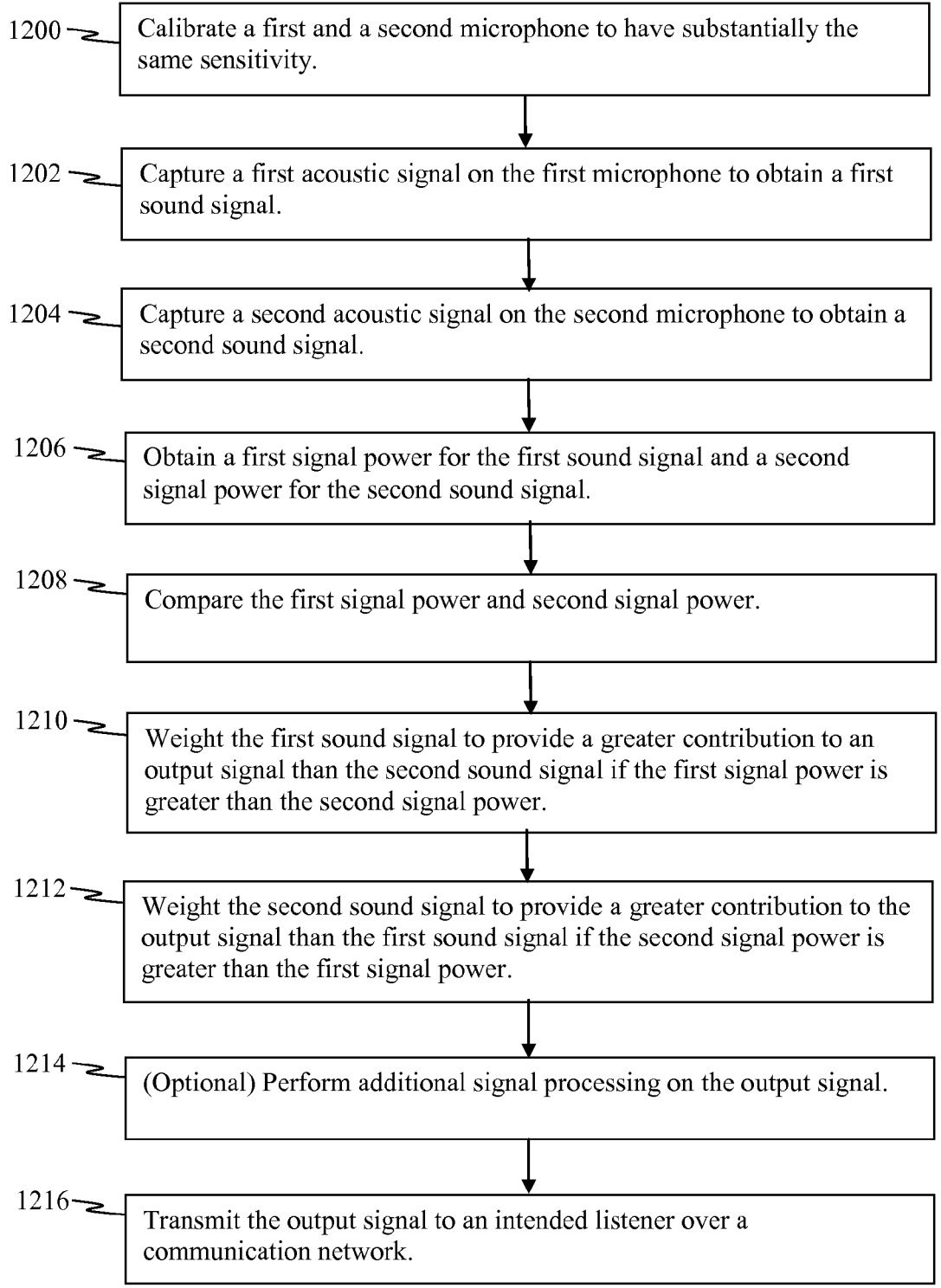
FIG. 12 is a flow chart illustrating a method operational on a mobile device to dynamically adjust signal weights based on signal characteristics.

FIG. 12 is a flow chart illustrating a method operational on a mobile device to dynamically adjust signal weights based on signal powers. A first and a second microphones may be calibrated to have substantially the same sensitivity 1200. A first acoustic signal may be captured by the first microphone to obtain a first sound signal 1202. Similarly, a second acoustic signal may be captured on the second microphone to obtain a second sound signal 1204. A first signal power may be obtained for the first sound signal and a second signal power may be obtained for the second sound signal 1206. The first signal power and second signal power may then be compared 1208 to each other. If the first signal power is greater than the second signal power, the first sound signal may be weighed (scaled) to provide a greater contribution to an output sound signal than the second sound signal 1210. If the second signal power is greater than the first signal power, the second sound signal may be weighed to provide a greater contribution to the output sound signal than the first sound signal 1212. Additional signal processing may be performed on the output sound signal 1214 prior to transmitting it to an intended listener over a communication network 1216.

The signal selection procedure may also be conducted on results obtained from multiple frames. For example, the active microphone sound signal and inactive microphone sound signal switches after the inactive microphone sound signal is greater than the active microphone sound signal over a number of consecutive frames.

Transition of Switching Between Signals

There are multiple ways to transition from using one microphone signal to using another microphone. The simplest way may be to do a hard switch in which the mobile voice mobile device starts using another microphone sound signal and drops a current microphone sound signal at an instance, as illustrated in the previous section. Usually, such hard transition will cause annoying artifacts due to signal discontinuity.

To avoid such artifacts, the transition can be made smoother. For example, a transition period of time for switching may be utilized. During the transition period, the portion of a signal from previously inactive microphone increases while portion of a signal from previously used microphone decreases until the switching finishes. For example, referring again to FIG. 10, a first phasing function f(t) 1024 may be used to phase in the inactive signal, and a second phasing function g(t) 1026 may be used to phase out the active signal. Generally, in obtaining an output signal during a transition period, a first sound signal (from a first microphone) may be blended with the second sound signal (from a second microphone) so that the contribution of the first sound signal is gradually decreased and the contribution of the second sound signal is gradually increased.

Figure 13:
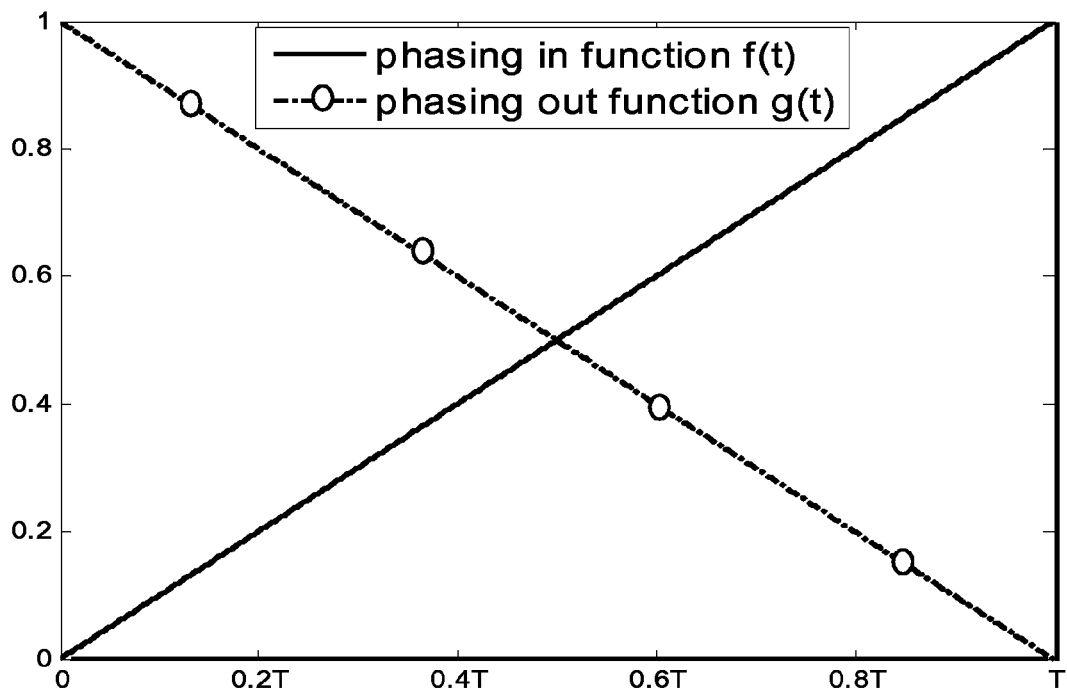
FIGS. 13 and 14 illustrate examples of transition curves for switching between a first signal and a second to obtain an output sound signal.
Figure 14:
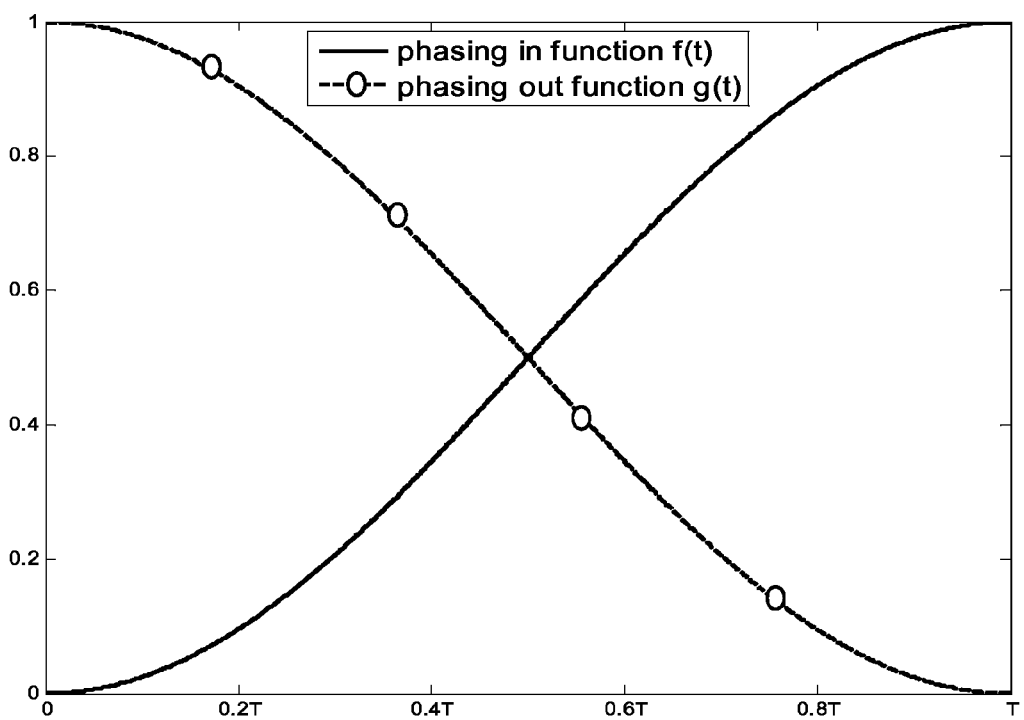

Two examples of smooth curve phasing are given in FIG. 13 (ramp function) and Error! Reference source not found. FIG. 14 (raised cosine function). In these examples, the switching transition period takes T seconds. During the transition period, the output signal s(t) is determined using, for example, Equation 9:

$$s(t) = s_{inactive}(t)f(t) + s_{active}(t)g(t) \quad \text{(Equation 9)}$$

In the Equation 9, f(t) is the phasing in function and g(t) is the phasing out function. During the transition period, the equality of Equation 10 holds, $$f(t) + g(t) = c, \quad \text{(Equation 10)}$$

where c is a constant. In FIGS. 13 and 14, f(t)+g(t) is set equal to one (1). After a transition period, the initially inactive microphone signal becomes active and the initially active microphone signal becomes inactive. FIG. 13 illustrates a linear-transition period while FIG. 14 illustrates a non-linear transition period.

Although various examples described herein use two-microphones, the features described herein may be generalized to multiple additional microphones. For example, K microphones may be used in a sound capture system. The output signal can be selected to be the input signal having the best SNR. For example, it can be formulated as $$s((uM+m)N+n) = s_i((uM+m)N+n) \quad \text{(Equation 11)}$$
$$i = \arg\max_k SNR_k(uM+m)$$
$$n = 0, \ldots, N-1,$$

where $SNR_k(uM+m)$ is the SNR of the kth microphone at frame $\Phi_k(\mu M+m)$. In Equation 11, the arg max function generates the index of the microphone with the maximum SNR.

Output Signal Based on Weighed Microphone Signals

The transitioning between two or more input sound signals illustrated in FIGS. 10, 13, and 14 may be extended to provide a weighed output sound signal.

Figure 15:
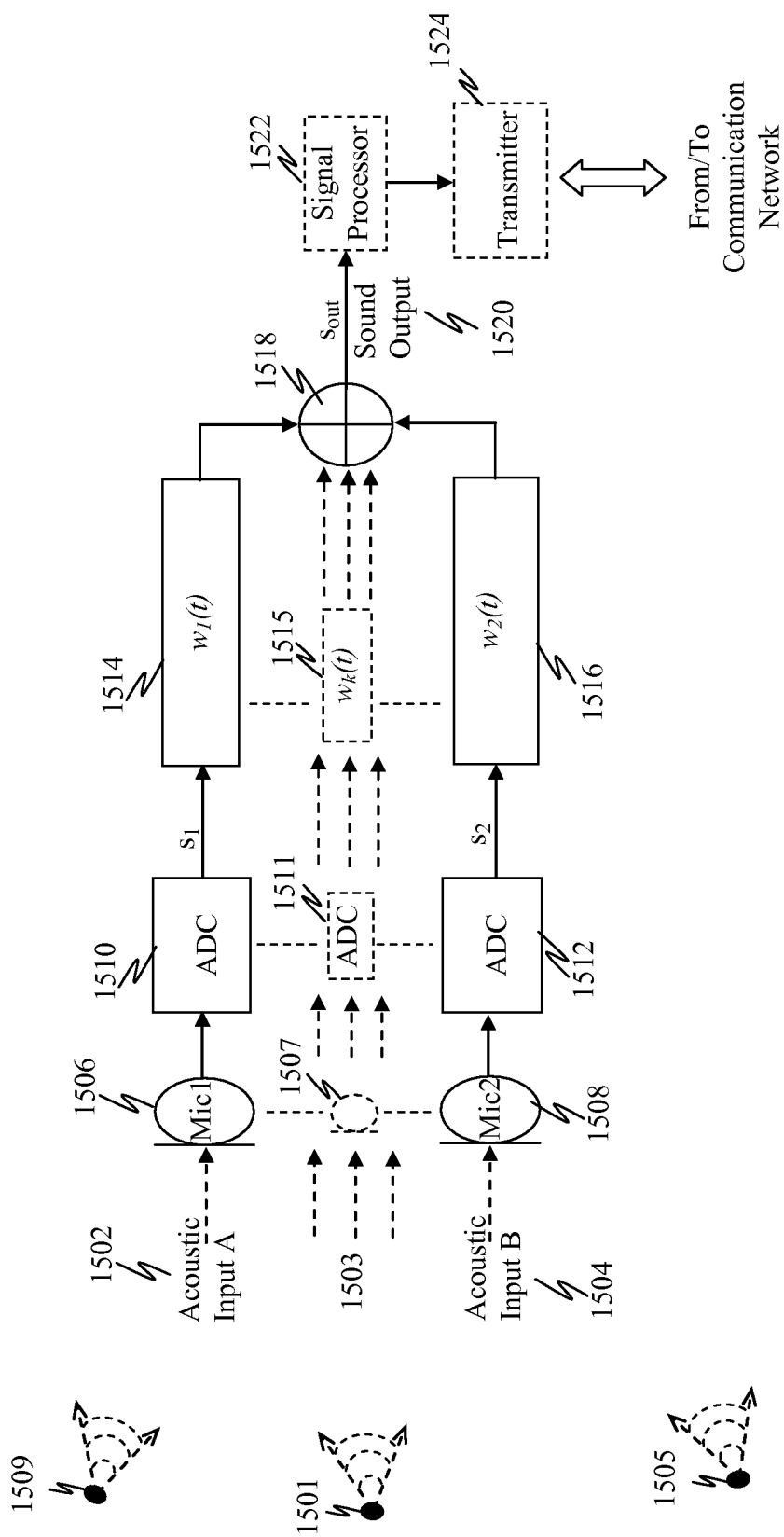
FIG. 15 is a block diagram illustrating how a mobile device may weigh a plurality of input sound signals from different microphones to provide an output sound signal.

FIG. 15 is a block diagram illustrating how a mobile device may weigh a plurality of input sound signals from different microphones to provide an output sound signal. In this example, an acoustic input signal A 1502 is captured by a first microphone 1506 as a first sound signal and an acoustic input signal B 1504 is captured by a second microphone 1508 as a second sound signal. Acoustic signal A 1502 and acoustic signal B 1504 may originate from the same sound sources 1501, 1505, and/or 1509 but may take different paths prior to reaching their respective microphones. The first and second sound signals (obtained from acoustic signals A 1502 and B 1504) may then be digitized by analog-to-digital converters 1510 and 1512. Additional acoustic signals 1503 may also be captured by one or more additional microphones 1507 as additional sound signals which may then be digitized by analog-to-digital converters 1511 to improve signal capture.

The digitized sound signals may then be weighed by weights 1514, 1515, and 1516 according to one or more factors or signal characteristics, such as their corresponding or relative signal-to-noise ratio, signal power, etc. The weight 1514, 1515, and 1516 for each sound signal, may be time-varying weight functions used to execute signal selection such that the sum of all weights at any one time is a constant value c. In one example, the weights 1514, 1515, and 1516 may vary from zero (0) to one (1) such that their total sum is one (1). The weighed signals may then be combined or added together into an output sound signal 1520. A signal processor 1522 may subsequently perform additional processing on the output signal 1520 (e.g., echo cancellation, noise reduction, automatic gain control (AGC), coding, etc.) before it may be transmitted by a transmitter 1524 over a communication network to an intended listener.

Figure 16:
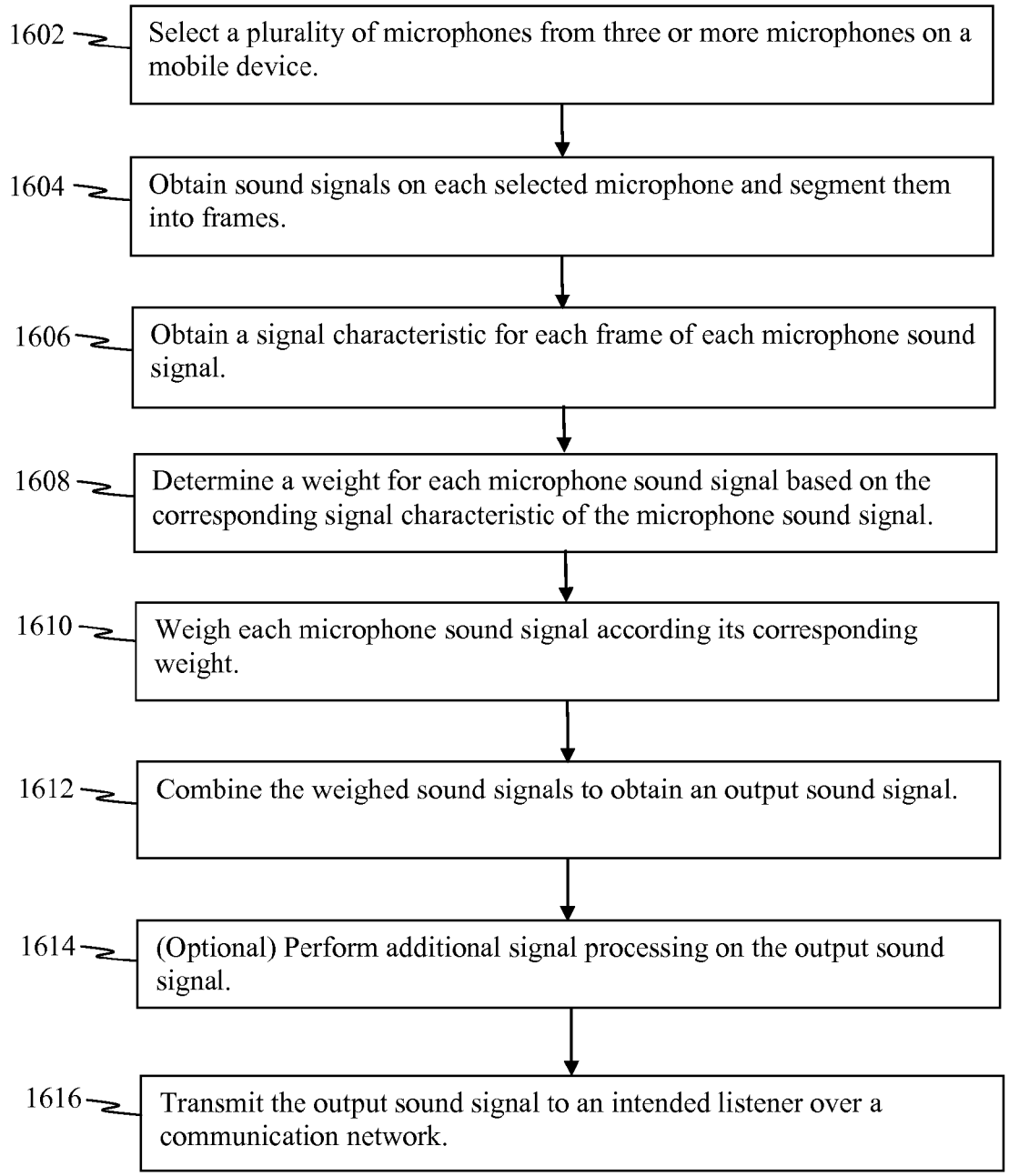
FIG. 16 is a flow chart illustrating a method operational on a mobile device to perform signal weighing for two or more microphones.

FIG. 16 is a flow chart illustrating a method operational on a mobile device to perform signal weighing for two or more microphones. This method illustrates the process of weighing two sound signals from two microphones but the same method may be extended to weigh signals from additional microphones. A plurality of microphones may be selected from three or more microphones on a mobile device 1602. Sound signals may be obtained from each selected microphone (e.g., from acoustic signals captured at each microphone) and segmented into frames 1604. A signal characteristic (e.g., signal power, signal-to-noise ratio, etc.) is obtained for each frame of each microphone sound signal 1606. The signal characteristic for each frame of each microphone sound signal is used to determine a weight for each microphone sound signal 1608. For instance, the weight for a particular microphone sound signal may be obtained by comparing a first characteristic (e.g., signal power, signal-to-noise ratio, etc.) of its frames to a second characteristic (e.g., signal power, signal-to-noise ratio, etc.) for frames corresponding to one or more other microphone sound signals. Each microphone sound signal may be weighted (or scaled) according to its corresponding weight 1610. In a more generalized form, the mobile device may use a combination of signals from the two microphones as follows:

$$s_{out}(t) = w_1(t)s_1(t) + w_2(t)s_2(t) \quad \text{(Equation 12)}$$

where, $w_1(t)$ and $w_2(t)$ are time-varying weight functions used to execute signal combination. At any time t, the equality of Equation 12 holds:

$$w_1(t) + w_2(t) = c \quad \text{(Equation 13)}$$

where c is a constant. If $s_1(t)$ has higher SNR, $w_1(t)$ is set to be close to c and $w_2(t)$ is set close to zero(0), and vice versa.

In the Equation 12 the weighed functions $w_1(t)$ and $w_2(t)$ may be determined, for example, by the signal SNR of the two microphone signals. For example, if $SNR_1(uM+m)$ is greater than $SNR_2(uM+m)$, $w_1((uM+m)N+n)$ is set to close to c while $w_2((uM+m)N+n)$ is set to close to zero (0). If $SNR_1(uM+m)$ is less than $SNR_2(uM+m)$, $w_1((uM+m)N+n)$ is set to close to zero (0) while $w_2((uM+m)N+n)$ is set to close to c. In the transition period, the relationship between $w_1(t)$ and $w_2(t)$ is similar to that between f(t) and g(t) which is illustrated in FIGS. 10, 13, and 14.

The weighted sound signals may then be combined to obtain an output sound signal 1612. Additional signal processing (e.g., echo cancellation, noise reduction, gain control, coding, etc.) may optionally be performed on the output sound signal 1614 prior to transmitting the output signal to an intended listener over a communication network 1616.

In the more generalized form, the output signal $s_{out}$ can be expressed as combination of multiple microphone signals, such as $$s_{out}((uM+m)N+n) = \quad \text{(Equation 14)}$$

$$\sum_{k=1}^{K} w_k((uM+m)N+n)s_k((uM+m)N+n)$$

where $$\sum_{k=1}^{K} w_k((uM+m)N+n) = c,$$

c is a constant, and $w_k$ is the weight function for a particular signal frame $s_k$.

According to yet another configuration, a circuit in a mobile device may be configured or adapted to obtain a first sound signal from a first microphone. The same circuit, a different circuit, or a second section of the same or different circuit may be configured or adapted to obtain a second sound signal from a second microphone, wherein each of the first and second sound signals includes at least a portion of a first source signal from a first sound source. In addition, the same circuit, a different circuit, or a third section of the same or different circuit may be configured or adapted to obtain a first signal characteristic for the first sound signal. Similarly, the same circuit, a different circuit, or a fourth section may be configured or adapted to obtain a second signal characteristic for the second sound signal, wherein both the first and second signal characteristics are associated with a same signal characteristic. The portions of the circuit configured or adapted to obtain the first and second sound signals may be directly or indirectly coupled to the portion of the circuit(s) that obtain the signal characteristics, or it may be the same circuit. A fourth section of the same or a different circuit may be configured or adapted to weighing the first and second sound signals based on the signal characteristics. A fifth section of the same or a different circuit may be configured or adapted to combine the weighed first and second sound signals to obtain an output sound signal. The fifth section may advantageously be coupled to the fourth section, or it may be embodied in the same circuit as the fourth section. One of ordinary skill in the art will recognize that, generally, most of the processing described in this disclosure may be implemented in a similar fashion. Any of the circuit(s) or circuit sections may be implemented alone or in combination as part of an integrated circuit with one or more processors. The one or more of the circuits may be implemented on an integrated circuit, an advance RISC Machine (ARM) processor, a digital signal processor (DSP), a general purpose processor, etc.

One or more of the components, steps, and/or functions illustrated in FIGS. 1, 2, 3, 4, 5, 6, 7, 8, 9, 10, 11, 12, 13, 14, 15 and/or 16 may be rearranged and/or combined into a single component, step, or function or embodied in several components, steps, or functions. Additional elements, components, steps, and/or functions may also be added. The apparatus, devices, and/or components illustrated in FIGS. 1, 2, 3, 6, 8, 10, 13, 14 and/or 15 may be configured or adapted to perform one or more of the methods, features, or steps described in FIGS. 4, 5, 7, 9, 11, 12 and/or 16. The algorithms described herein may be efficiently implemented in software and/or embedded hardware.

Those of skill in the art would further appreciate that the various illustrative logical blocks, modules, circuits, and algorithm steps described in connection with the configurations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features described herein can be implemented in different systems. For example, the signal selection and/or combination module 320 (FIG. 3) may be implemented in a single circuit or module, on separate circuits or modules, executed by one or more processors, executed by computer-readable instructions incorporated in a machine-readable or computer-readable medium, and/or embodied in a handheld device, mobile computer, and/or mobile phone.

It should be noted that the foregoing configurations are merely examples and are not to be construed as limiting the claims. The description of the configurations is intended to be illustrative, and not to limit the scope of the claims. As such, the present teachings can be readily applied to other types of apparatuses and many alternatives, modifications, and variations will be apparent to those skilled in the art.

What is claimed is:

1. A method for improving sound reception on a mobile device, comprising:
    obtaining a first sound signal from a first microphone;
    obtaining a second sound signal from a second microphone, wherein each of the first and second sound signals includes at least a portion of a first source signal from a first sound source;
    selecting the first sound signal as an output sound signal for a first time frame;
    obtaining a first signal characteristic for the first sound signal over a second time frame, wherein the second time frame is subsequent to the first time frame;
    obtaining a second signal characteristic for the second sound signal over the second time frame, wherein both the first and second signal characteristics are associated with a same signal characteristic;
    changing the output sound signal by transitioning from the first sound signal to the second sound signal during the second time frame if the second signal characteristic is greater than the first signal characteristic by at least a minimum threshold, wherein changing the output sound signal from the first sound signal to the second sound signal includes:
        gradually decreasing the contribution of the first sound signal to the output sound signal, and
        gradually increasing the contribution of the second sound signal to the output sound signal.

2. The method of claim 1 wherein the first sound signal and the second sound signal are obtained within overlapping time windows.

3. The method of claim 1 wherein the first sound signal and the second sound signal are obtained from independent mixtures of the first source signal and one or more other source signals and noise.

4. The method of claim 1 wherein the first and second microphones are positioned on different surfaces of the mobile device.

5. The method of claim 1 further comprising:
    performing additional signal processing on the output sound signal; and
    transmitting the output sound signal to an intended listener over a communication network.

6. The method of claim 5 wherein the additional signal processing includes at least one of echo cancellation, noise reduction, automatic gain control, and coding.

7. The method of claim 5 wherein the communication network is a wireless communication network.

8. The method of claim 1 further comprising:
    segmenting the first sound signal into a first plurality of consecutive frames;
    segmenting the second sound signal into a second plurality of consecutive frames;
    obtaining a first plurality of signal characteristics for the first plurality of consecutive frames for the first sound signal; and
    obtaining a second plurality of signal characteristics for the second plurality of consecutive frames for the second sound signal;
    wherein the first signal characteristic is obtained from the first plurality of signal characteristics and the second signal characteristic is obtained from the second plurality of signal characteristics.

9. The method of claim 1 wherein
    decreasing the contribution of the first sound signal includes scaling the first sound signal from one to zero, and
    increasing the contribution of the second sound signal includes scaling the second sound signal from zero to one.

10. The method of claim 1 further comprising:
    determining a first signal-to-noise ratio for the first sound signal;
    determining a second signal-to-noise ratio for the second sound signal; and
    if the second signal-to-noise ratio is greater than the first signal-to-noise ratio, weighing the second sound signal to provide a greater contribution to the output sound signal than the first sound signal during the transition from using the first sound signal to the second sound signal.

11. The method of claim 10 further comprising:
    segmenting the first sound signal into a first plurality of consecutive frames;
    obtaining a first plurality of consecutive signal powers for the first plurality of consecutive frames for the first sound signal; and
    searching for a minimum signal power in the plurality of consecutive signal powers for the first plurality of consecutive frames to obtain a noise floor estimate with which to obtain the first signal-to-noise ratio.

12. The method of claim 1 further comprising:
    calibrating the first and second microphones to have substantially the same sensitivity.

13. The method of claim 1 wherein the first and second signal characteristics are signal powers.

14. The method of claim 1 wherein the contribution from the first sound signal is decreased and the contribution from the second sound signal is increased according to linear functions.

15. The method of claim 1 wherein the contribution from the first sound signal is decreased and the contribution from the second sound signal is increased according to non-linear functions.

16. The method of claim 1 further comprising:
selecting the first and second microphones from a plurality of three or more microphones on the mobile device, wherein such selection is performed based on which of the three or more microphones a desired signal quality.

17. The method of claim 1 further comprising:
obtaining at least one additional sound signal from at least one additional microphone, wherein the at least one additional sound signal includes at least a portion of a first source signal from the first sound source;
obtaining at least one additional signal characteristic for the at least one additional sound signal;
weighing the at least one additional sound signal and the first and second sound signals based on the first signal characteristic, second signal characteristic, and the at least one additional signal characteristic; and
combining the weighed first sound signal, second sound signal, and at least one additional sound signal to obtain the output sound signal.

18. A mobile device comprising:
a first microphone configured to obtain a first sound signal;
a second microphone configured to obtain a second sound signal, wherein each of the first and second sound signals includes at least a portion of a first source signal from a first sound source; and
a signal selection module configured to select the first sound signal as an output sound signal for a first time frame;
  obtain a first signal characteristic for the first sound signal over a second time frame, wherein the second time frame is subsequent to the first time frame;
  obtain a second signal characteristic for the second sound signal over the second time frame, wherein both the first and second signal characteristics are associated with a same signal characteristic;
  change the current output sound signal by transitioning from the first sound signal to the second sound signal during the second time frame if the second signal characteristic is greater than the first signal characteristic by at least a minimum threshold, wherein changing the current output sound signal includes:
    gradually decreasing the contribution of the first sound signal to the output sound signal, and
    gradually increasing the contribution of the second sound signal to the output sound signal.

19. The mobile device of claim 18 further comprising:
a signal processor configured to perform at least one of echo cancellation, noise reduction, automatic gain control, and coding on the output sound signal; and
a transmitter configured to transmit the processed output sound signal via a wireless communication network.

20. The mobile device of claim 18 wherein the first sound signal and the second sound signal are obtained from an acoustic signal within overlapping time windows, and the first and second microphones are positioned on different surfaces of the mobile device.

21. The mobile device of claim 18 further comprising:
a first analog-to-signal converter configured to segment the first sound signal into a first plurality of consecutive frames;
a second analog-to-signal converter configured to segment the second sound signal into a second plurality of consecutive frames;
wherein the signal selection module is further configured to
  obtain a plurality of consecutive signal characteristics for the first plurality of consecutive frames for the first sound signal; and
  obtain a second plurality of consecutive signal characteristics for the second plurality of consecutive frames for the second sound signal;
  wherein the first signal characteristic is obtained from the first plurality of signal characteristics and the second signal characteristic is obtained from the second plurality of signal characteristics.

22. The mobile device of claim 18 wherein the signal selection module is further configured to
determine a first signal-to-noise ratio for the first sound signal;
determine a second signal-to-noise ratio for the second sound signal; and
weigh, during the transition from using the first sound signal to the second sound signal, the second sound signal to provide a greater contribution to the output sound signal than the first sound signal if the second signal-to-noise ratio is greater than the first signal-to-noise ratio.

23. The mobile device of claim 18 wherein the signal selection module is further configured to
select the first and second microphones from a plurality of three or more microphones on the mobile device, wherein such selection is performed based on which of the three or more microphones a desired signal quality.

24. The mobile device of claim 18 wherein the signal selection module is further configured to
obtain at least one additional sound signal from at least one additional microphone, wherein the at least one additional sound signal includes at least a portion of the first source signal from the first sound source;
obtain at least one additional signal characteristic for the at least one additional sound signal;
weight the at least one additional sound signal and the first and second sound signals based on the first signal characteristic, second signal characteristic, and the at least one additional signal characteristic; and
combine the weighed first sound signal, second sound signal, and at least one additional sound signal to obtain the output sound signal.

25. A mobile device comprising:
means for obtaining a first sound signal from a first microphone;
means for obtaining a second sound signal from a second microphone, wherein each of the first and second sound signals include at least a portion of a first source signal from a first sound source;
means for selecting the first sound signal as an output sound signal for a first time frame;
means for obtaining a first signal characteristic for the first sound signal over a second time frame, wherein the second time frame is subsequent the first time frame;
means for obtaining a second signal characteristic for the second sound signal over the second time frame, wherein both the first and second signal characteristics are associated with a same signal characteristic;
means for changing the output sound signal by transitioning from the first sound signal to the second sound signal during the second time frame if the second signal characteristic is greater than the first signal characteristic by at least a minimum threshold, wherein the means for changing the output sound signal includes:

means for gradually decreasing the contribution of the first sound signal to the output sound signal, and means for gradually increasing the contribution of the second sound signal to the output sound signal.

26. The mobile device of claim 25 further comprising:

means for performing at least one of echo cancellation, noise reduction, automatic gain control, and coding on the output sound signal; and means for transmitting the processed output sound signal via a wireless communication network.

27. A circuit for improving sound quality, wherein the circuit is adapted to:

obtain a first sound signal from a first microphone;

obtain a second sound signal from a second microphone, wherein each of the first and second sound signals include at least a portion of a first source signal from a first sound source;

select the first sound signal as an output sound signal for a first time frame;

obtain a first signal characteristic for the first sound signal over a second time frame, wherein the second time frame is subsequent to the first time frame;

obtain a second signal characteristic for the second sound signal over the second time frame, wherein both the first and second signal characteristics are associated with a same signal characteristic;

change the output sound signal by transitioning from the first sound signal to the second sound signal during the second time frame if the second signal characteristic is greater than the first signal characteristic by at least a minimum threshold, wherein changing the output sound signal includes:

gradually decreasing the contribution of the first sound signal to the output sound signal, and gradually increasing the contribution of the second sound signal to the output sound signal.

28. The circuit of claim 27, wherein the circuit is an integrated circuit.

29. A computer-readable medium comprising instructions for improving sound signal reception, which when executed by a processor causes the processor to obtain a first sound signal from a first microphone;

obtain a second sound signal from a second microphone, wherein each of the first and second sound signals include at least a portion of a first source signal from a first sound source;

select the first sound signal as an output sound signal for a first time frame;

obtain a first signal characteristic for the first sound signal over a second time frame, wherein the second time frame is subsequent to the first time frame;

obtain a second signal characteristic for the second sound signal over the second time frame, wherein both the first and second signal characteristics are associated with a same signal characteristic;

change the output sound signal by transitioning from the first sound signal to the second sound signal during the second time frame if the second signal characteristic is greater than the first signal characteristic by at least a minimum threshold, wherein changing the output sound signal includes:

gradually decreasing the contribution of the first sound signal to the output sound signal, and gradually increasing the contribution of the second sound signal to the output sound signal.

30. The computer-readable medium of claim 29 further comprising instructions for which when executed by a processor causes the processor to select the first and second microphones from a plurality of three or more microphones, wherein such selection is performed based on which of the three or more microphones has the best signal quality.

* * * * *